United States Patent [19]

Nagai et al.

[11] Patent Number: 5,432,831
[45] Date of Patent: Jul. 11, 1995

[54] VACUUM OPTICAL SYSTEM

[75] Inventors: Komei Nagai, Hachiouji; Yoshinori Iketaki, Oume; Yoshiaki Horikawa, Hachiouji, all of Japan

[73] Assignee: Olympus Optical Co., Ltd., Tokyo, Japan

[21] Appl. No.: 118,246

[22] Filed: Sep. 9, 1993

[30] Foreign Application Priority Data

Sep. 10, 1992 [JP] Japan .................................. 4-242232
Sep. 14, 1992 [JP] Japan .................................. 4-244841

[51] Int. Cl.⁶ ............................................. G02B 21/26
[52] U.S. Cl. ....................................... 378/44; 378/145; 359/871
[58] Field of Search ................... 378/34, 43, 44, 49, 378/79, 80, 81, 84, 85, 145, 146, 205, 206; 359/627, 871, 811, 820, 856

[56] References Cited

U.S. PATENT DOCUMENTS

| | | | |
|---|---|---|---|
| 4,103,168 | 7/1978 | Sturrock et al. | 250/492.2 X |
| 4,803,713 | 2/1989 | Fujii | 378/34 |
| 5,107,526 | 4/1992 | Hoover | 378/43 |
| 5,138,491 | 8/1992 | Horikawa et al. | 359/627 X |
| 5,157,702 | 10/1992 | Middleton et al. | 378/84 X |
| 5,182,763 | 1/1993 | Iizuka et al. | 378/34 |

OTHER PUBLICATIONS

P. S. Duke; X-Ray Microscopy at the Daresbury Laboratory, *X-Ray Microscopy*, Springer-Verlag, 1984, pp. 232–241.

Neimann, et al: The Gottingen X-Ray Microscope and X-Ray Microscopy Experiments at the Bessy Storage Ring *X-Ray Microscopy*, Springer-Verlag, 1984, pp. 192–202.

Bruce, et al: Scanning Fabry–Perot Interferometer for Precision Measurement Rev. Sci. Instrum., vol. 46, No. 4, Apr. 1975, pp. 379–382.

Trail et al: Compace Scanning Soft-X-Ray Microscope Using a Laser-Produced Plasma Source and Normal-Incidence Multilayer Mirrors, Jun. 1, 1989/vol. 14, No. 11/Optics Letters, pp. 539–541.

*Primary Examiner*—David P. Porta
*Attorney, Agent, or Firm*—Cushman, Darby & Cushman

[57] ABSTRACT

A vacuum optical system has a vacuum chamber for housing an optical system used in a vacuum. The vacuum chamber is equipped with a member, on which the optical system is at least mounted, supported by such parts that when a pressure in the vacuum chamber changes to deform the vacuum chamber, the amount of displacement transmitted to the optical system is smaller than a predetermined tolerance depending on an accuracy necessary for the optical system. Thus, the vacuum optical system can be obtained which does away with the need for readjustment of optical alignment and is compact.

24 Claims, 18 Drawing Sheets

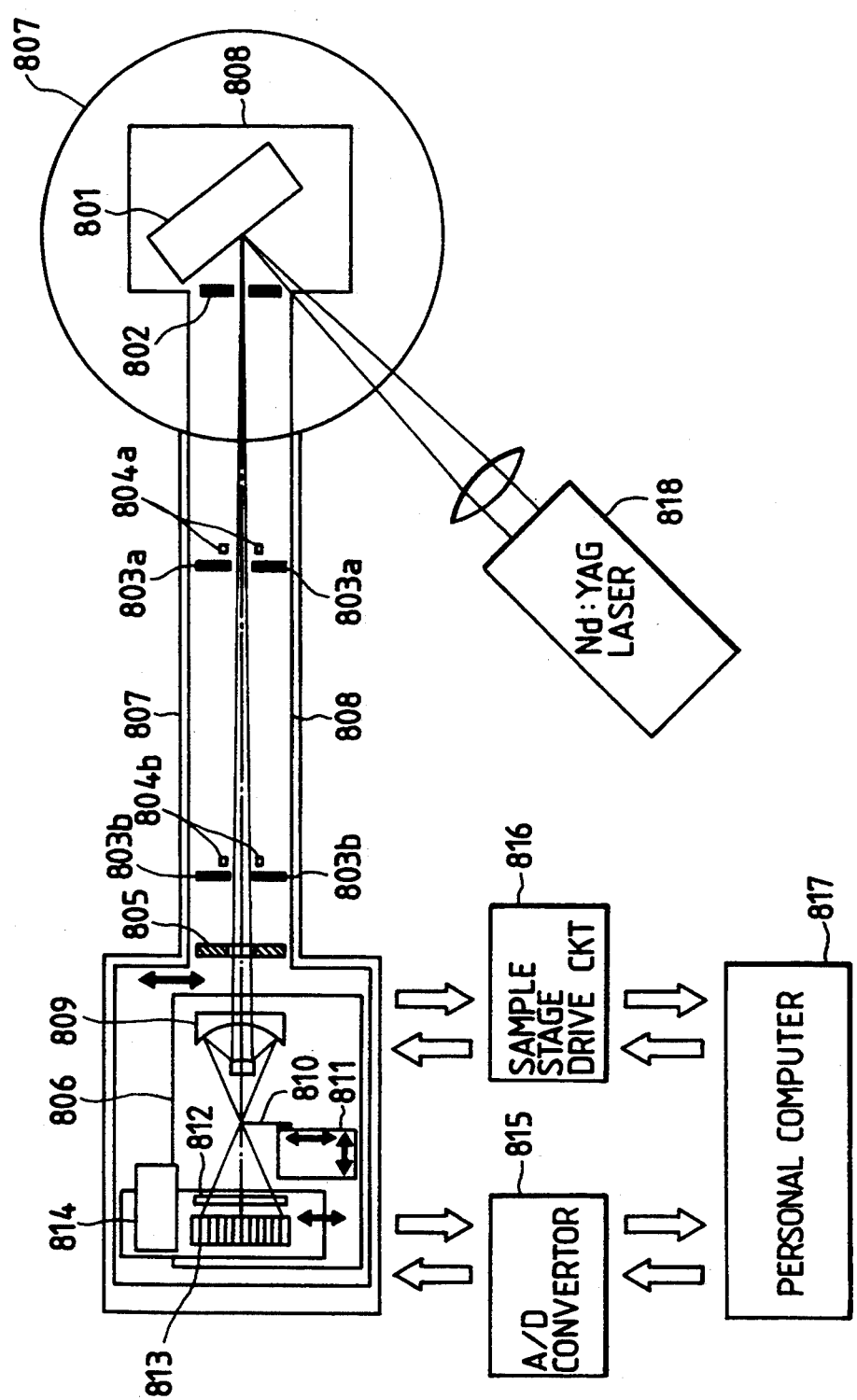

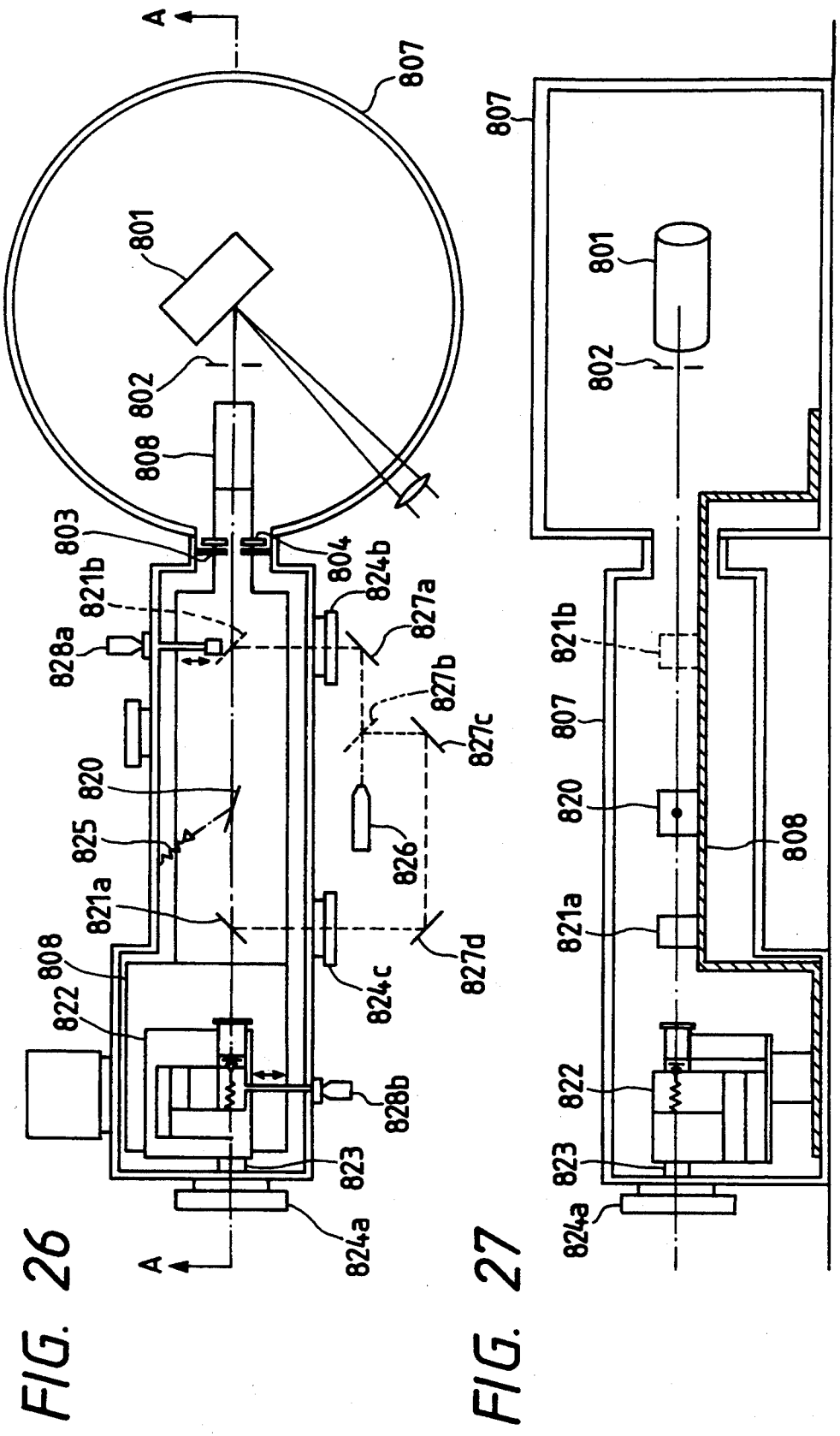

VACUUM OPTICAL SYSTEM

BACKGROUND OF THE INVENTION

1. Field of the Invention

This invention relates to a vacuum optical system equipped with vacuum chambers for incorporating an optical system used in a vacuum, and in particular, to an optical system using soft X rays.

2. Description of the Related Art

The development in recent years of the source of soft X rays, such as radiation, has promoted the research of soft X-ray optics. For semiconductor exposure devices, line widths being transferred become finer because of the microstructure of their integrated circuits, and the wavelengths of light used in exposure extend from the ultraviolet region to the X-ray region. For microscopes, attention is devoted to observations in the so-called "water window" region of wavelengths from 22 to 44 Å which is generally reputed to be suitable for microscopy of biological specimens. As for analytical devices, a great number of absorption edges of elements exist in the X-ray region, thereby allowing the application to elementary analysis to be attempted. Further, the research and development of X-ray optical elements are promoted, and various X-ray microscopes are proposed which use the X-ray optical elements as objective lenses.

FIG. 1 shows an imaging X-ray microscope making use of a grazing-Incidence Wolter optical system. In this diagram, reference numeral 1 represents a radiation source; 2 a condenser mirror; 3 a sample; and 4 a Wolter optical system. The X-ray microscope of the type has the feature of enabling radiation ranging in short wavelength to several angstroms to be imaged. The Wolter optical system 4, which is capable of imaging white radiation, can be used as an X-ray collecting lens for a probe where secondary electrons discharged from the sample 3 are observed.

FIG. 2 illustrates a scanning optical microscope making use of zone plates. This microscope is designed so that white X rays emitted from a synchrotron radiation source 10 are monochromatized with two zone plates, a condenser zone plate 11 and a micro-zone plate 12, and focused on a sample 13, and so that a transmitted microscope image of the sample 13 is photographed and displayed on a CRT monitor 16. The sample 13 is moved in the direction of a double-pointed arrow A by a driving motor 14 and a scanning mechanism 15, while the micro-zone plate 12 is moved in the direction of a double-pointed arrow B by a voice coil 17. The sample 13 is thus scanned two-dimensionally. The X-ray microscope of the type has the feature that arbitrary monochromatic X rays can be focused by shifting the position of each zone plate.

FIG. 3 shows a scanning X-ray microscope utilizing a laser plasma radiation source and a Schwarzschild optical system. This microscope is constructed so that laser radiation emitted from a laser radiation source 20 is focused on a target 21 to produce X rays, which are imaged, through a pinhole 22 and a filter 23, on a sample 25 in a Schwarzschild optical system 24, and the X rays transmitted through the sample 25 are detected by a detector 26. Reference numeral 27 denotes a scanning stage for scanning the sample 25 two-dimensionally. The X-ray microscope of the type employs a compact, high-luminance laser plasma radiation source, and thus is expected to be used as a laboratory-use microscope. The Schwarzschild optical system 24, in which the surfaces of two spherical mirrors are coated with soft X-ray multilayer films, is capable of imaging soft X-rays of particular wavelength with a spatial resolving power as high as about 50 nm.

Of the microscopes mentioned above, the scanning X-ray microscope has the feature that the transmitted microscope image of the sample can be obtained with a high resolving power defined by the optical system, irrespective of the spatial resolving power of the detector. The detection of photoelectrons and scattered X rays in addition to transmitted X rays makes it possible to secure the microscope images of various data (for example, data of particular protein contained in the sample) except for the transmitted X-ray image of the sample. Further, there is the advantage that the use of the laser plasma radiation source leads to a compact system excellent in function.

Since soft X rays are considerably absorbed into the air, it is necessary to incorporate an optical system, such as the scanning X-ray microscope, in a vacuum as shown in FIG. 3. For means of supporting the optical system, there is a manipulator attached to a vacuum flange and a stage mounted directly to a vacuum chamber, with which optical alignment is performed.

The vacuum optical system of the prior art has the problems that (a) the stages which are the mounting bases of the optical system, as shown in FIG. 4, are fixed integral with or directly to the vacuum chamber or the vacuum flange, and if evacuation is performed after the alignment in the air, as shown in FIG. 5, deformation of the vacuum chamber due to the atmospheric pressure will cause misalignment, (b) the drive of the stage for a moving mechanism lying in the vacuum chamber in a vacuum state needs a vacuum motor which provides a heat discharge and a piezoelectric (PZT) element using high voltage, and thus the entire device becomes oversized, (c) the observation with soft X rays needs a long time to attain a high vacuum necessary for a high voltage detector, such as a photomultiplier tube, and (d) a rapid air flow caused by the evacuation may break a thin film for enclosing an object for observation, an ultrathin film filter used to remove unwanted light in the soft X-ray observation, and a thin film window for taking out soft X rays from the vacuum chamber. Hence, the prior art vacuum optical system is not necessarily used favorably.

Further, where the laser plasma radiation source is used as the radiation source of the scanning X-ray microscope, there is the problem that scattered particles discharged from the source may break a filter for removing ultraviolet rays, or may contaminate the mirror surfaces of the Schwarzschild optical system. Moreover, in the scanning X-ray microscope in which the pinhole is placed in front of the source, as mentioned above, and the image of the pinhole is formed by an X-ray optical element to produce a microbeam, the problem has been encountered that the intensity of X rays emitted from the target varies because of flickering of the laser beam, and the intensity of the microbeam also varies, with the result that the quality of the microscope image deteriorates.

Although the above problems arise from the fact that soft X rays must be treated in a vacuum, the same problems hold for any optical system which must be treated In a vacuum. For the optical system which must be treated in a vacuum, an example is shown in FIG. 6, in which a Fabry-Perot Interferometer is provided in a vacuum chamber for the absolute measurement of wavelength of a stabilized laser (C. F. Bruce and R. M. Duffy, "Scanning Fabry-Perot interferometer for precision measurement", Rev. Sci. Instrum., Vol. 46, No. 4, pp. 379–382, 1975). In this case, a measurement is made by leaking a small amount of gas to a chamber held in a vacuum state, and the same problems arise from the deformation of the vacuum chamber caused by a change of the difference between the internal and external pressures of the vacuum chamber.

Further, there is another problem, although it is not present in the prior art, that under the presence of air, an error in measurement is produced by the disturbance of air. For example, a measuring device using a Mach-Zehnder interferometer, such as that shown in FIG. 7, is adapted to measure the path difference of split light for photometry. Hence, this device raises the difficulty that where the measurement is made with the tolerance of a hundredth of the wavelength of the light, a portion A surrounded by a broken line shown In FIG. 7, for splitting and recombining the optical path, has a significant effect on the result of the measurement in accordance with the disturbance and density of air.

SUMMARY OF THE INVENTION

It is, therefore, an object of the present invention to provide a vacuum optical system which dispenses with the need for the operation that optical alignment adjusted in the air is readjusted in a vacuum after evacuation.

The vacuum optical system according to the present invention is equipped with an optical system mounting member in a vacuum chamber. This mounting member is supported by parts, small in displacement, such that even though displacement is caused to the vacuum chamber by the deformation of the vacuum chamber attributable to a change of air pressure within the vacuum chamber, the displacement transferred to the optical system being used does not exceed a predetermined tolerance depending on the accuracy necessary for the optical system.

According to the vacuum optical system, the alignment of the optical system can be maintained through the evacuation and release of the vacuum chamber. Specifically, where the optical system, as shown in FIGS. 8 and 9, is placed on a plate of the optical system mounting member, if a displacement δ of the parts supporting the member caused by the deformation of the vacuum chamber is less than the accuracy required for the optical system, the alignment accuracy of the optical system will be held through the evacuation and release of the vacuum chamber.

A device having a moving mechanism placed on the optical system mounting member is connected with a driving mechanism attached to the vacuum chamber by using a power transmitter having a means capable of compensating the deformation of the vacuum chamber. Thus, even though the vacuum chamber is deformed, the displacement is not transferred to the moving mechanism, so that the moving mechanism can be driven from outside the vacuum chamber without optical misalignment, and the device which is simple in structure and compact in size can be obtained.

The vacuum optical system includes a soft X-ray detector for detecting soft X rays converged by a soft X-ray lens which focuses soft X rays emitted from a soft X-ray source onto an object, a vacuum chamber for detector for housing the soft X-ray detector, a pipe connecting the foregoing vacuum chamber and the vacuum chamber for detector, and a gate valve situated midway of the pipe and capable of cutting off a vacuum between the two vacuum chambers. This arrangement reduces the time required to attain a vacuum sufficient for microscopy and decreases a rapid flow of air in the vacuum chambers.

Thus, according to the present invention, even though the vacuum chamber is deformed before and after evacuation, the optical system in the vacuum chamber will not be misaligned, and a compact vacuum optical system is provided in which the moving mechanism can be operated from outside the vacuum chamber. For X-ray microscopy, the time for evacuation shortens and the thin film structure, such as the window of the vacuum chamber, is not broken.

The present invention is applicable not only to a soft X-ray optical system but to any optical systems using the vacuum optical system, for example, a visible optical system for eliminating the disturbance of air as in a measuring instrument making use of interference; a vacuum-ultraviolet optical system such as that of a semiconductor exposure device; and a soft X-ray optical system used as an analytical device, microscope, or semiconductor exposure device.

The vacuum optical system of the present invention is equipped with a vacuum chamber housing an optical system used in a vacuum so that the complete optical system including a radiation source and the optical system used in a vacuum is placed on a single optical-system mounting member provided in the vacuum chamber. The vacuum optical system, unlike that shown in FIGS. 8 and 9, is constructed so that the complete optical system is place on the single optical-system mounting member and provided in the vacuum chamber (FIGS. 10 and 11). In this case, as shown in FIG. 12, the complete optical system is not necessarily provided in the vacuum chamber In FIG. 12, the complete optical system, although it is placed on the single mounting member, constitutes the vacuum optical system in which the complete optical system is not contained in the vacuum chamber, but part is provided inside the vacuum chamber and the remaining part outside the vacuum chamber. The boundary between vacuum and atmosphere consists of bellows. Because the bellows are formed to be not rigid but flexible, when the pressure within the vacuum chamber is changed, the deformation of the vacuum chamber will not affect the member on which the optical system is mounted.

According to the present invention, the complete optical system including a radiation source for an X-ray microscope is mounted not to the vacuum chamber itself, but on a base plate of sufficient strength and thickness, and is incorporated in the vacuum chamber. Hence, the optical system is not misaligned even in the deformation of the vacuum chamber, and the alignment of the optical system can be accurately held before and after evacuation.

A partition having an aperture through which X rays pass along the optical path is disposed between the laser plasma radiation source and the X-ray objective lens, and a magnetic field is created in a direction intersecting the optical path, preferably perpendicular thereto. In this way, scattered particles discharged from the laser plasma radiation source and ionized can be prevented from entering the X-ray imaging optical system. It is preferable that the partition is large in number, and the magnetic field increases in effect when produced in many places on the optical path. The placement of partitions makes it possible to considerably decrease the absolute amount of stray light of long wavelengths, such as ultraviolet light, which is emitted with X rays from the laser plasma radiation source and changes to a noise in microscope photography. Thus, a sharp microscope image can be obtained.

Further, according to the present invention, the X-ray detector for monitoring the variation of intensity of the source radiation enables monitor signals indicative of the intensity variation of X rays to be detected. When the intensity of the source radiation varies, the data of the transmitted microscope image of the sample also vary at the same rate with respect to its intensity. If, therefore, such data are normalized by the monitor signals to correct the intensity variation of the source radiation, an exact transmitted microscope image can be secured which is free from the effect of the variation of the source radiation. In this case, it is necessary to monitor the intensity variation of X rays traveling the outer side of an effective aperture of the X-ray imaging optical system so that X rays passing through the aperture are not eclipsed.

This and other objects as well as the features and advantages of the present invention will become apparent from the following detailed description of the preferred embodiments when taken in conjunction with the accompanying drawings.

BRIEF DESCRIPTION OF THE DRAWINGS

FIG. 25 is a plan view showing a fourth embodiment according to the present invention;

FIGS. 26 and 27 are a plan view and a sectional view taken along line A—A in FIG. 26, respectively, showing a fifth embodiment according to the present invention;

DETAILED DESCRIPTION OF THE PREFERRED EMBODIMENTS

Figure 1:
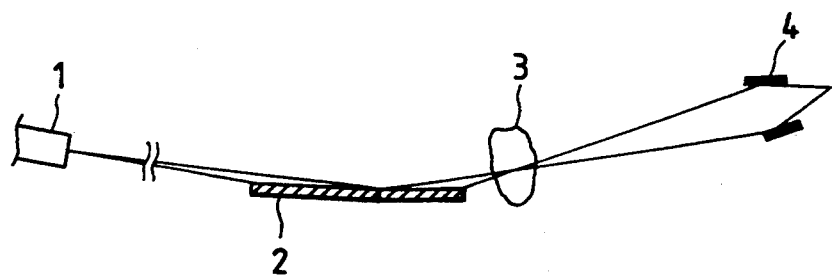
FIG. 1 is a view showing essential parts of an imaging X-ray microscope using a grazing-incidence Wolter optical system in the prior art.
Figure 2:
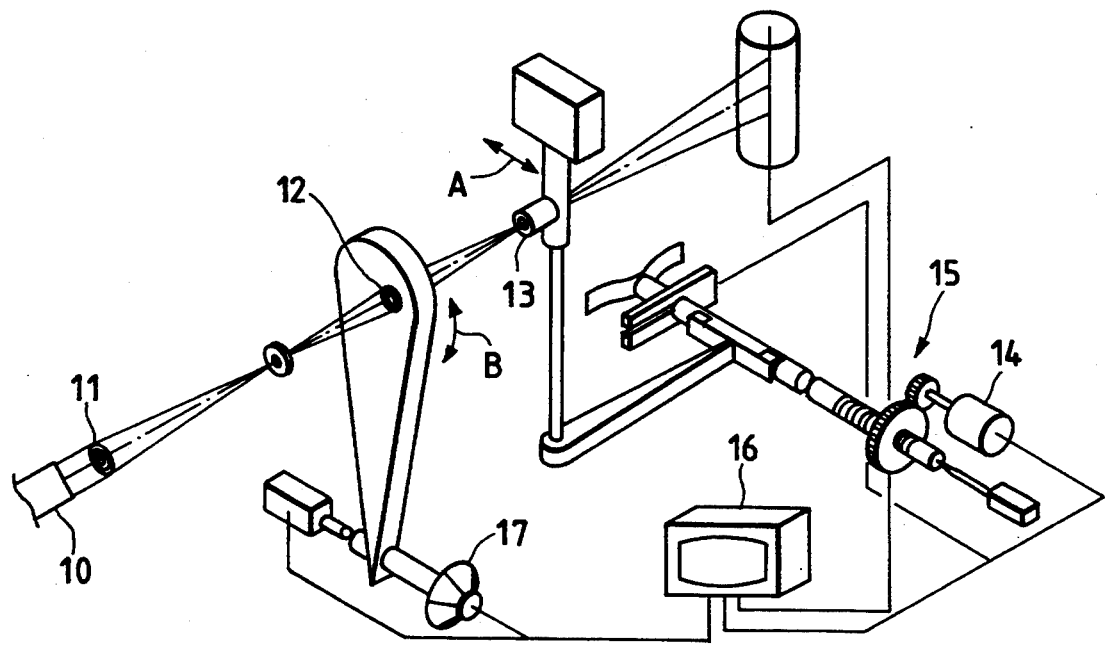
FIG. 2 is a view showing essential parts of a scanning optical microscope using zone plates in the prior art.
Figure 3:
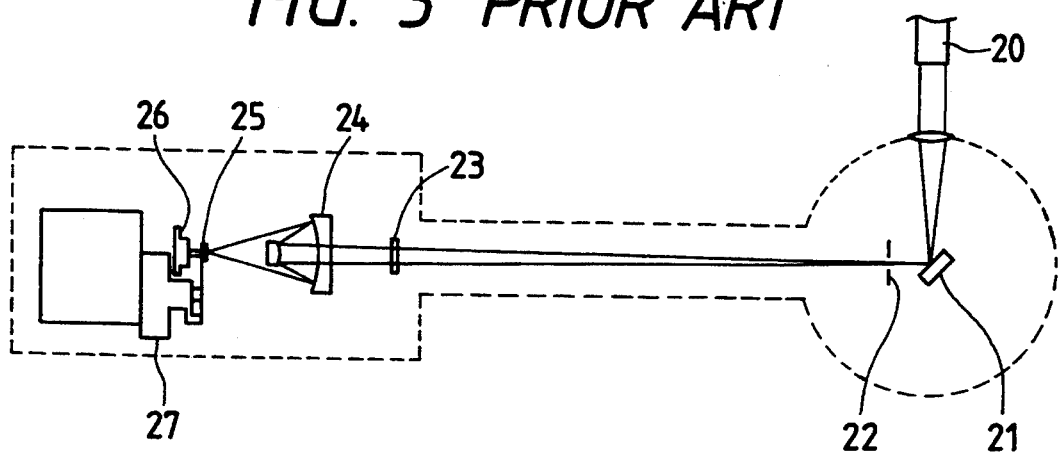
FIG. 3 is a view showing essential parts of a scanning X-ray microscope using a laser plasma radiation source and a Schwarzschild optical system in the prior art.
Figure 4:
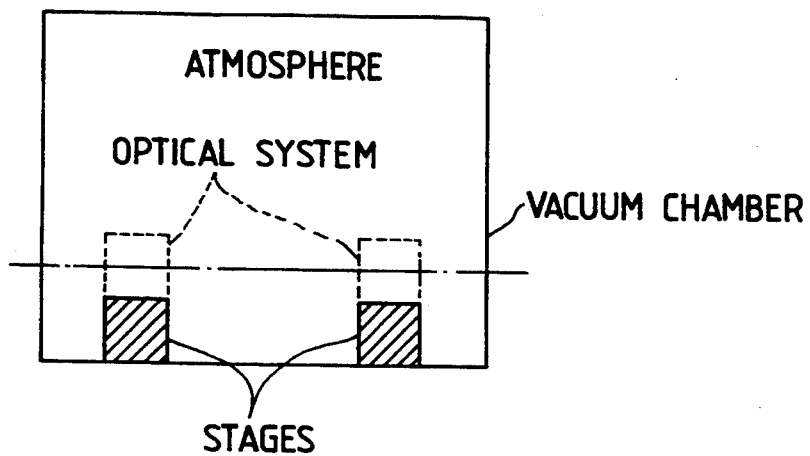
FIGS. 4 and 5 are explanatory views showing the states of optical alignment where a vacuum chamber is in atmospheric and vacuum conditions, respectively, in a vacuum optical system of the prior art.
Figure 5:
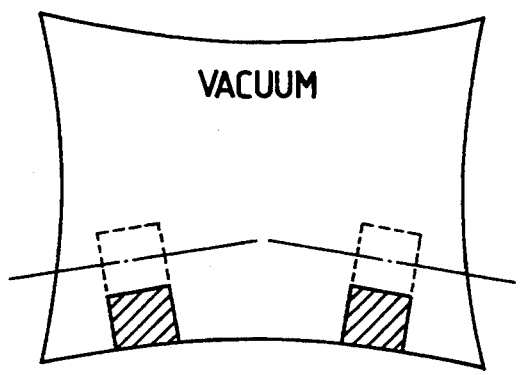
Figure 6:
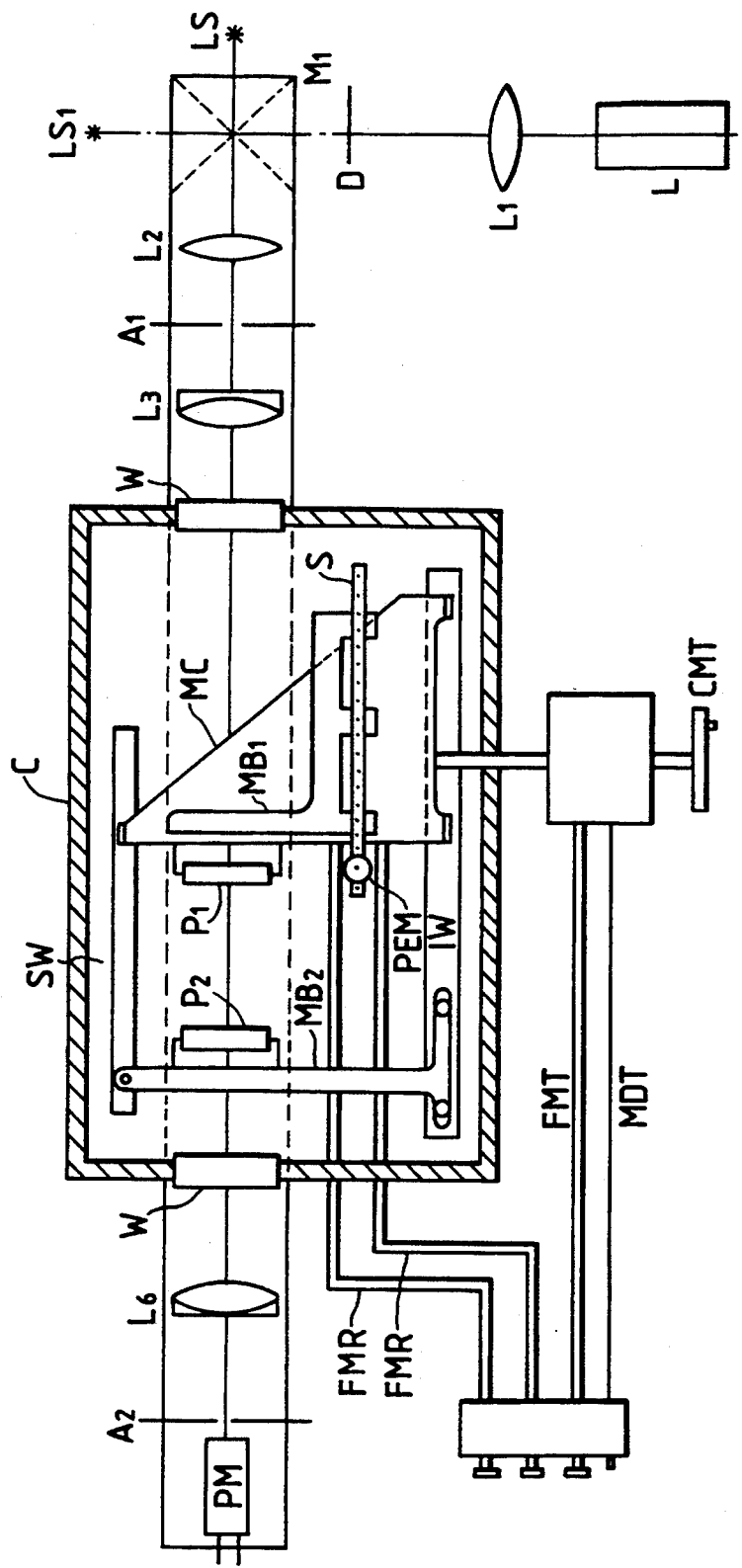
FIG. 6 is a view showing an example where a Fabry-Perot interferometer is placed in the vacuum chamber.

Referring to the drawings, the embodiments of the present invention will be explained in detail below.

Figure 13:
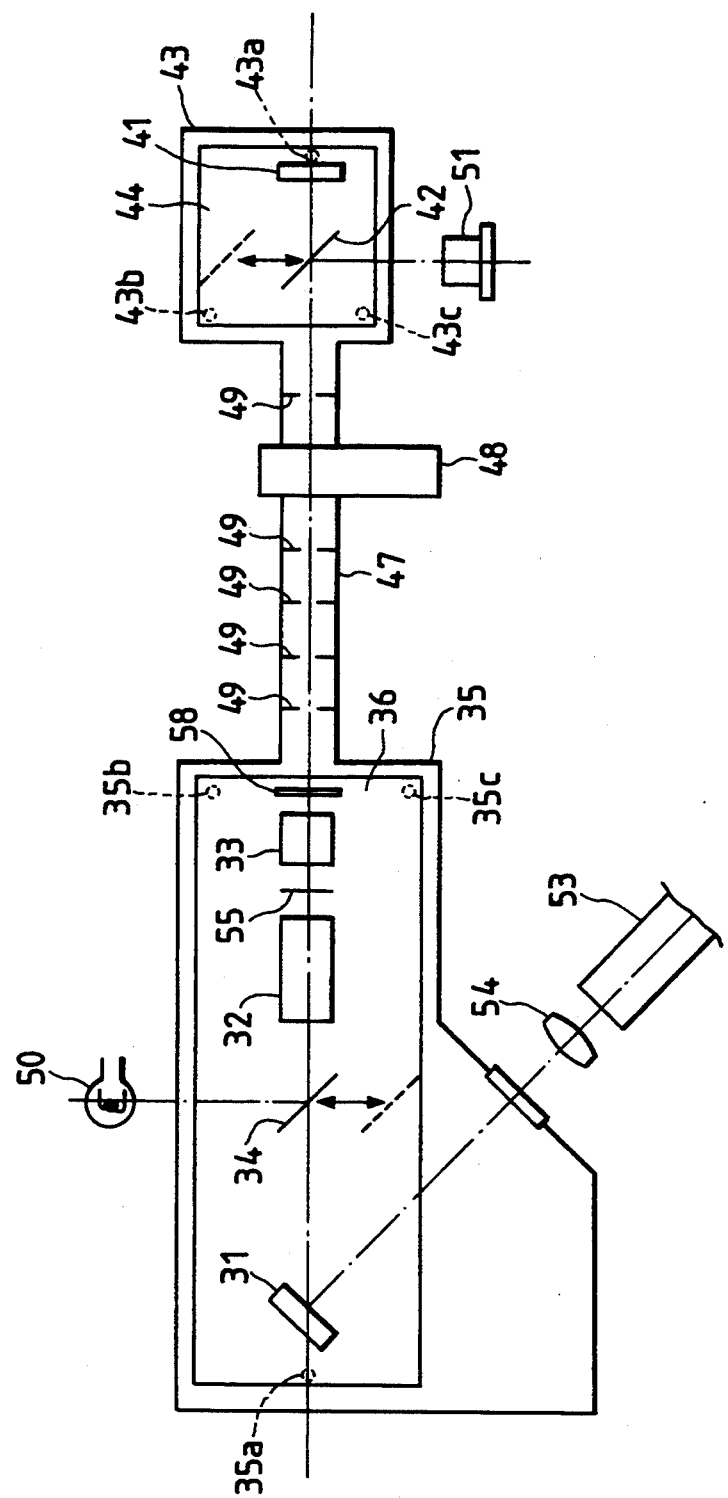
FIGS. 13 and 14 are plan and side views, respectively, showing a first embodiment of the vacuum optical system according to the present invention.
Figure 14:
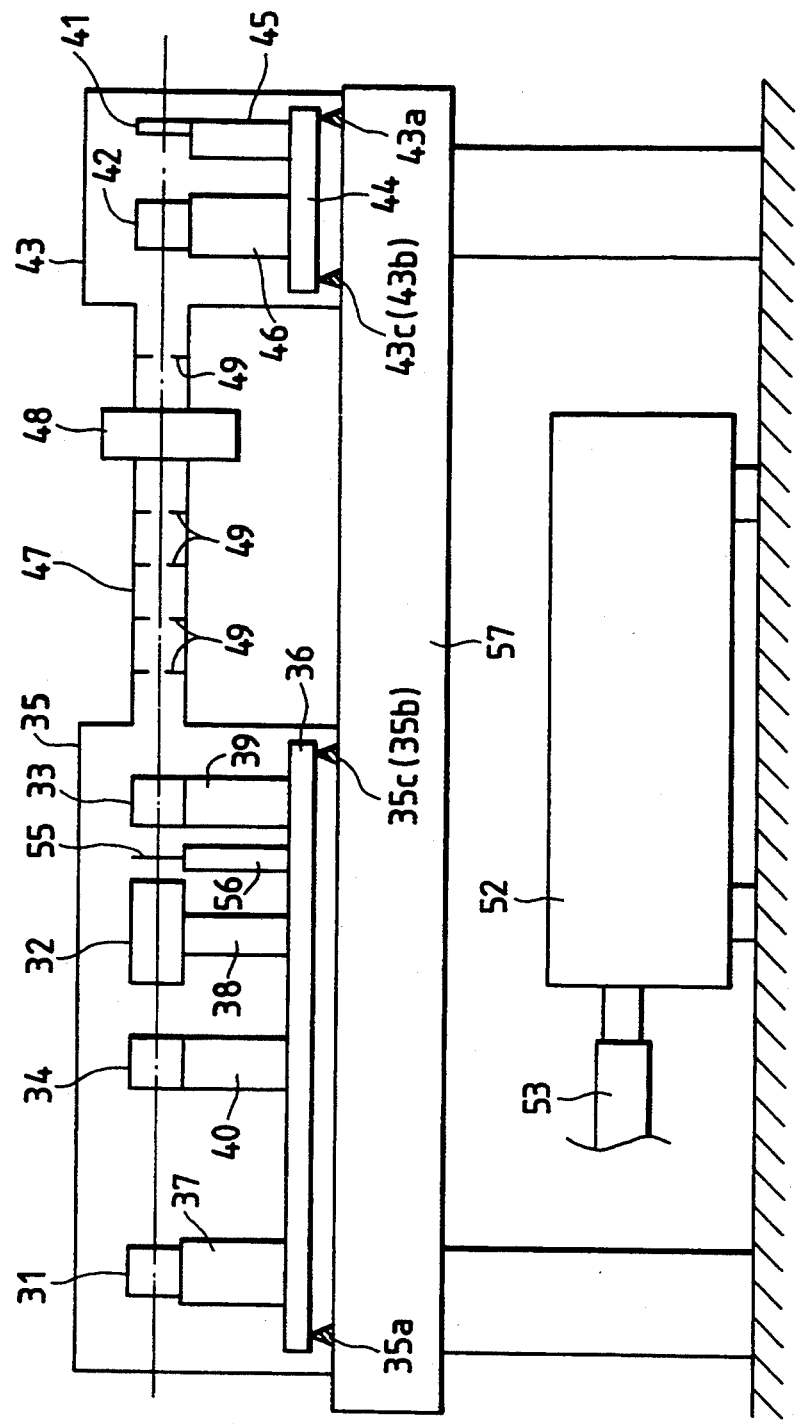

FIGS. 13 and 14 are plan and side views of a first embodiment of a soft X-ray optical system according to the present invention. In this embodiment, a soft X-ray microscope is adopted as an optical system, and a laser plasma radiation source is used as a soft X-ray source. Also, vacuum chambers and turbo molecular pumps for exhaust are mounted on a vibration-proof base. Reference numeral 31 represents a metallic target coming to an X-ray source; 32 a spheroidal condenser lens; 33 a Schwarzschild objective lens; and 34 a reflecting mirror for visible light, which are mounted to stages 37, 38, 39, and 40, respectively, on a plate 36 placed in a vacuum chamber 35. The plate 36 is supported at three points of ends 35a, 35b, and 35c of a bottom plate which affords minimum deformation in the cubic vacuum chamber 35. Reference numeral 41 denotes a soft X-ray detector, such as a micro-channel plate with a fluorescent face (which is hereinafter referred to as MCP) emitted with a wavelength different from that of incident X rays, and 42 denotes a reflecting mirror for visible light which is coated with an antireflection film in regard to the wavelength of incident laser radiation, which are mounted to stages 45 and 46, respectively, on a plate 44 placed in a vacuum chamber 43. The plate 44, like the plate 36, is supported at three points of ends 43a, 43b, and 43c of the bottom plate of the vacuum chamber 43. Numeral 47 represents a pipe connecting the vacuum chamber 35 and the vacuum chamber 43, and 48 represents a gate valve for cutting off a vacuum with respect to the vacuum chambers 35 and 43 so that they function as independent vacuum systems. The gate valve 48 is capable of opening and closing when both the vacuum chambers 35 and 45 are in an atmospheric or vacuum condition, so that optical alignment and focusing are performed in the atmospheric condition. Also, a plurality of shielding plates 49 is incorporated in the pipe 47. Numeral 50 designates a visible light source; 51 a visible eyepiece coated with an antireflection film in regard to the wavelength of incident laser radiation; 52 a high-power pulse YAG laser; 53 an optical fiber bundle; 54 a collecting lens; 55 a sample; 56 a sample stage; 57 a vibration-proof base for supporting the entire optical system; and 58 a soft X-ray filter for removing vacuum-ultraviolet light.

Figure 15:
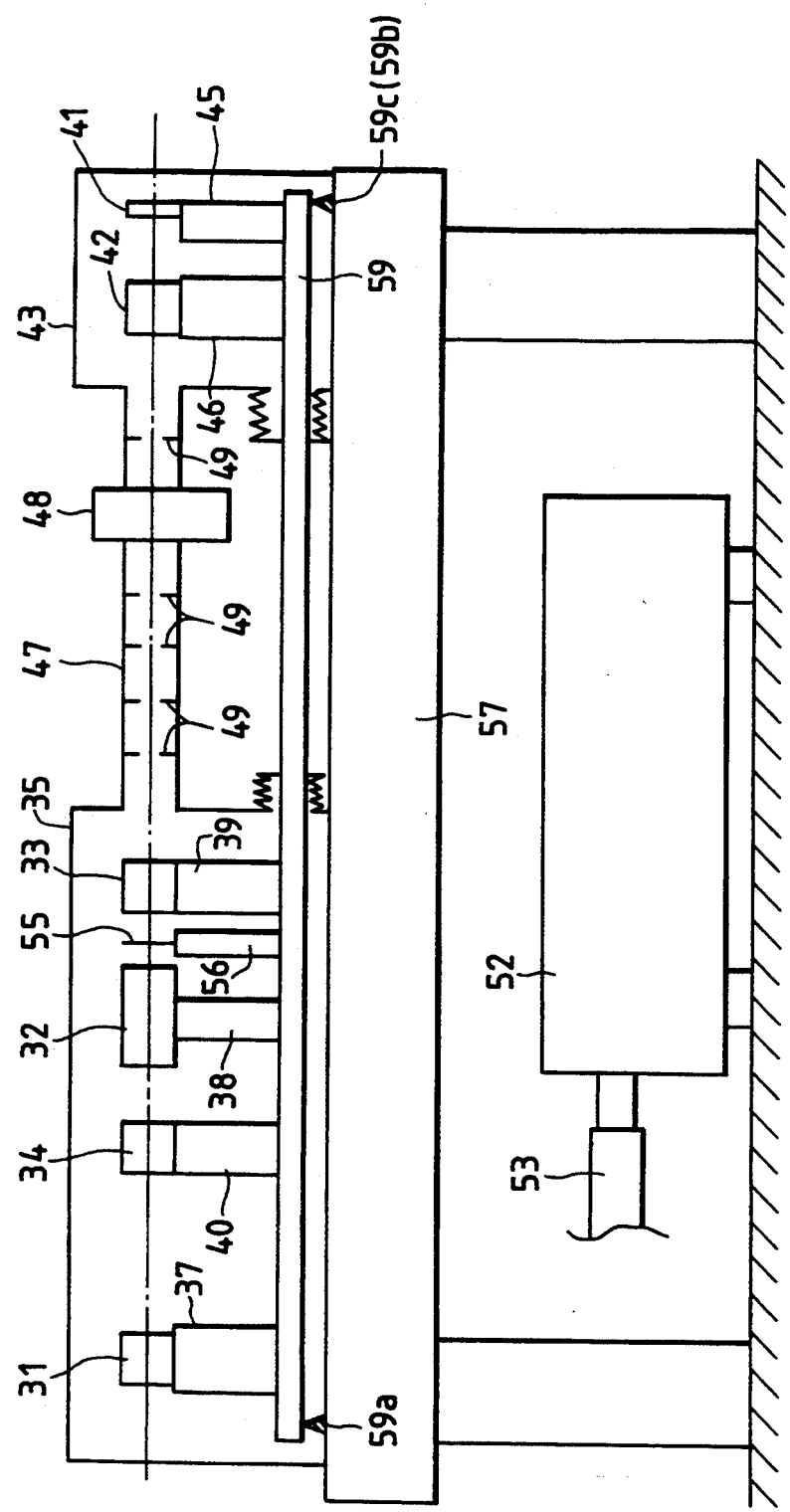
FIG. 15 is a view showing a modification of the vacuum optical system in FIG. 14.

Here, where the radiation source is relative to soft X rays, an exciting radiation source for producing soft X rays is required. In this instance, the complete optical system including the exciting radiation source is placed on a single optical-system mounting member. This, as shown in FIG. 15, may be constructed so that the complete optical system is placed on a single optical-system mounting member 59 and supported at three points of ends 59a, 59b, and 59c. Alternatively, it may well be constructed as in FIG. 14.

Figure 16:
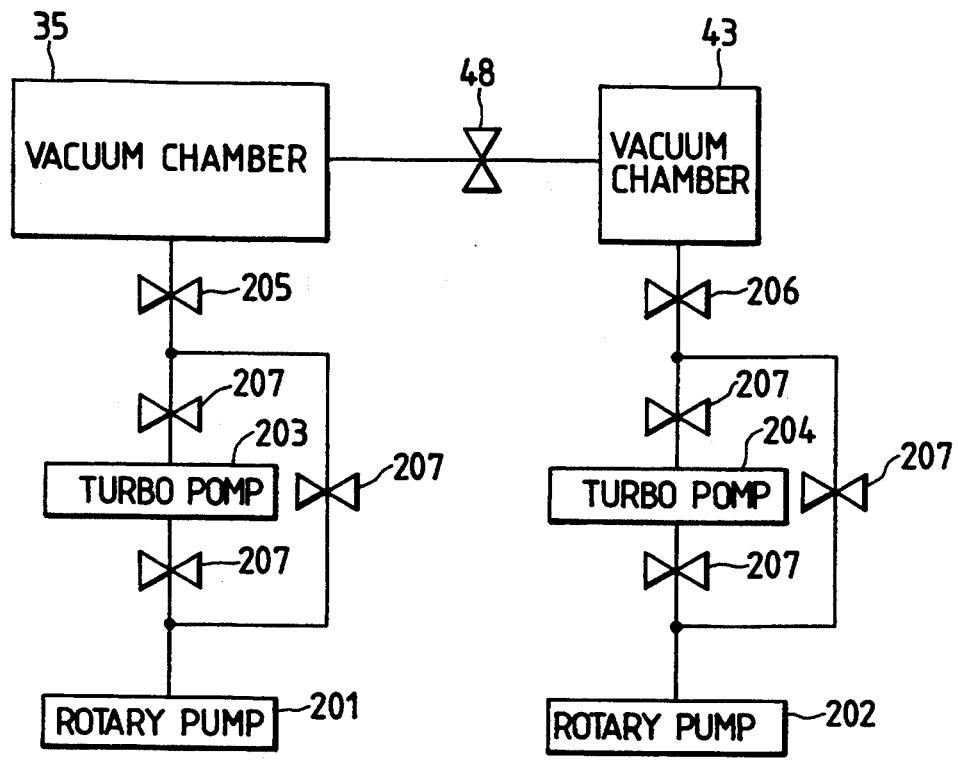
FIGS. 16 and 17 are block diagrams showing examples of evacuation devices used in the first embodiment.
Figure 17:
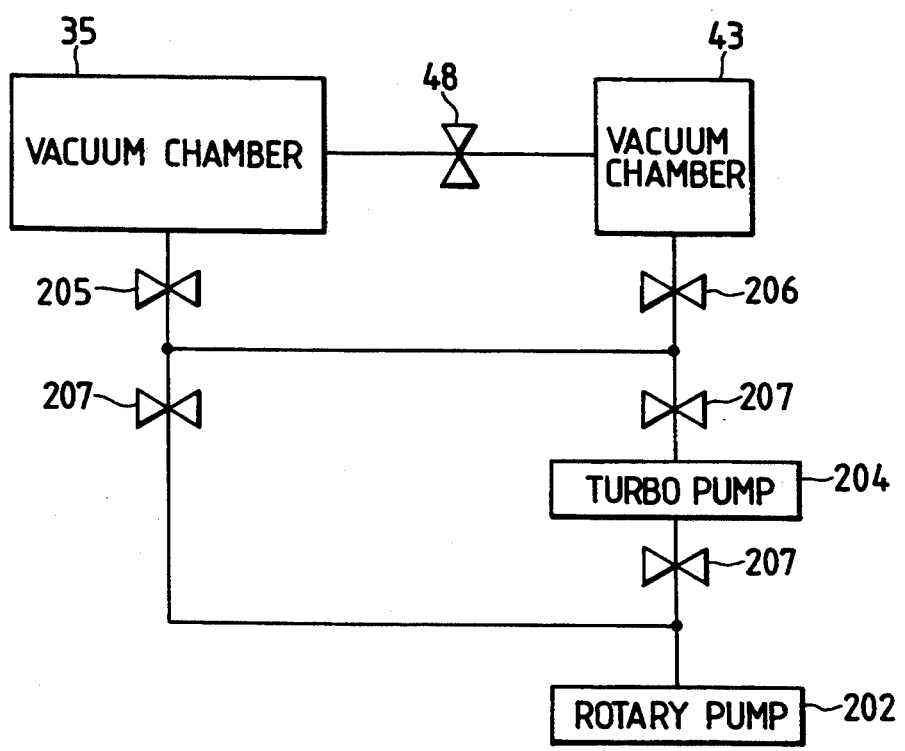

The visible light reflecting mirror 34 is removably disposed in the optical path for soft X rays between the metallic target 31 and the condenser lens 32 so that visible light incident from the visible light source 50 on the vacuum chamber 35 is reflected. The reflected light is led along substantially the same optical axis as in the soft X rays to enter the objective lens 33. On the other hand, the visible light reflecting mirror 42 is removably disposed in the optical path for soft X rays between the objective lens 33 and the soft X-ray detector 41 so that the visible light from the objective lens 33 is reflected. The reflected light is separated from the optical axis for the soft X rays and imaged at the position conjugate with the light-receiving face of the soft X-ray detector 41. The image of the visible light on the optical path, separated by the visible light reflecting mirror 42, can be observed through the eyepiece 51 from outside the vacuum chamber 43. These components constitute an observation system for visible light. Also, an exhaust system for the vacuum chambers 35 and 43, as depicted in FIG. 16, comprises rotary pumps 201 and 202, turbo molecular pumps 203 and 204, conductance valves 205 and 206 in which the sectional areas of their exhaust diameters are variable, and butterfly valves 207 arranged in plural places. Alternatively, as shown in FIG. 17, the two vacuum chambers may well be evacuated in such a way that a pump set is used and each valve is properly opened or closed.

The laser radiation from the high-power pulse YAG laser 52 is conducted, through the optical fiber bundle 53, directly before the collecting lens 54 coated with the antireflection film in regard to the wavelength of the laser radiation, and is focused onto the metallic target 31 by the collecting lens 54. Soft X rays emanating from the target 31 are focused onto the sample 55 by the condenser lens 32, and the soft X rays transmitted and diffracted through the sample 55 are converged onto the soft X-ray detector 41 by the objective lens 33 and observed through the fluorescent face of the detector. Also, the condenser lens 32 is of a spheroidal mirror made of oxygen-free copper and the Schwarzschild optical system constituting the objective lens 33 by which soft X rays are reflected is coated with the multilayer film having reflectance distribution with respect to soft X rays in a predetermined wavelength region. Each of these two lenses, which has a high reflectance in respect of visible light, can also be used as a lens for visible light.

Figure 18:
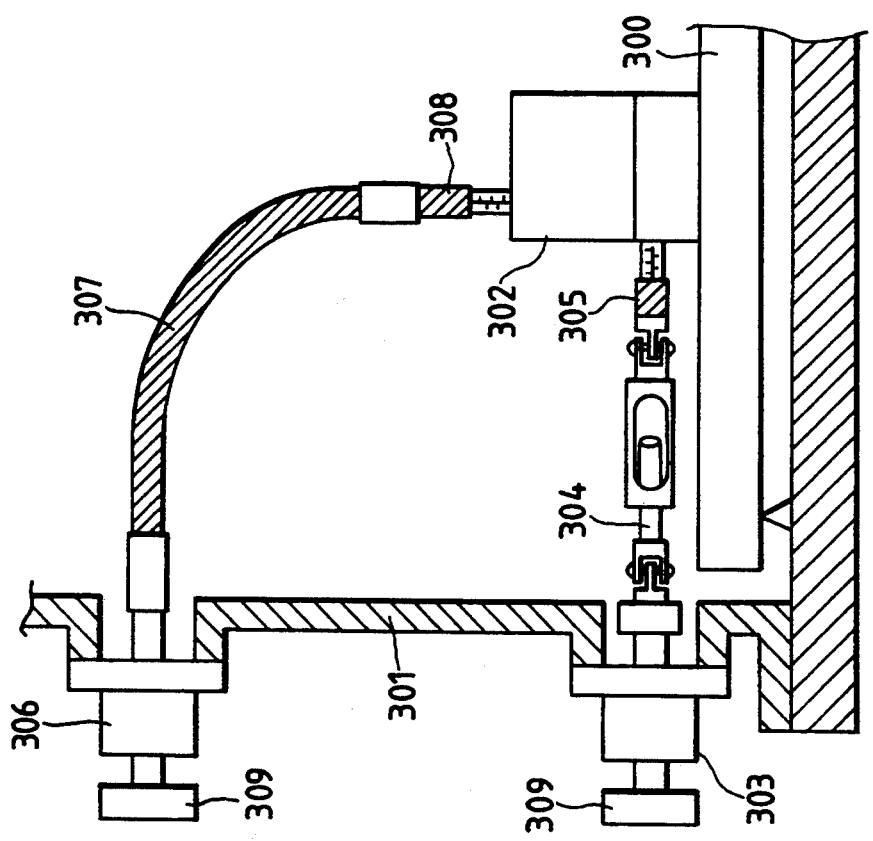

FIG. 18 is a schematic diagram showing the mechanism by which a stage (moving mechanism) 302 mounted on a plate 300 in a vacuum chamber 301 is operated from outside the vacuum chamber. A rotary guide terminal 303 and a universal joint enables the drive of a micrometer 305 of the stage 302 in the vacuum chamber, while a rotary guide terminal 306 and a flexible shaft 307 operate a micrometer 308. Reference numeral 309 denotes handles for rotating the universal joint 304 and the flexible shaft 307.

Figure 19:
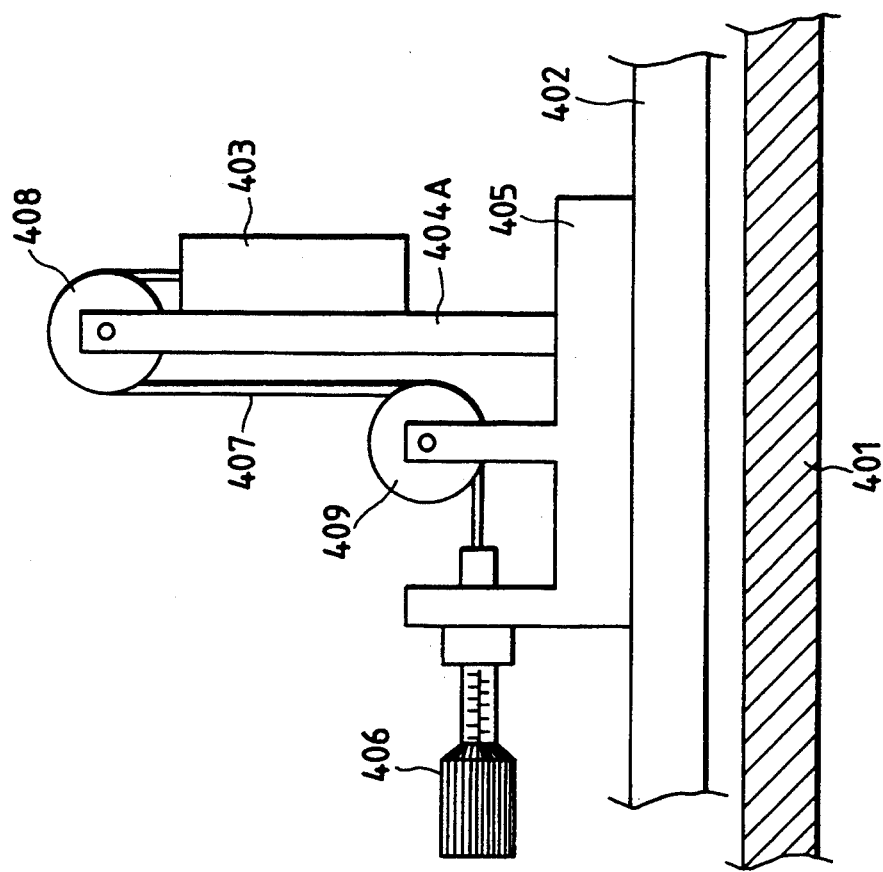
FIGS. 18 to 21 are structural views showing examples of a moving mechanism, driving mechanism, and power transmission mechanism which are applicable to the first embodiment.

FIG. 19 is a schematic diagram showing the mechanism by which a stage 403 capable of being fixed on a plate 402 in a vacuum chamber 401 is operated from outside the vacuum chamber. The stage 403 is provided on the face along the longitudinal axis of a supporting base 404A, and at the end of the supporting base 404A, a fixed terminal (such as a screw) is provided which is disposed so that its longitudinal axis is situated in a direction perpendicular to the plate 402. The supporting base 404A is fixed and supported through the fixed terminal on a stationary base 405. Further, a micrometer 406 is provided on the stationary base 405 so that it can be operated from outside the vacuum chamber 401 by means of a rotary guide terminal and a universal joint which are not shown. One end of a wire 407 is connected to the stage 403, while the other is connected through pulleys 408 and 409 to the micrometer 406. The stage 403 is moved vertically along the longitudinal axis of the supporting base 404A, through the wire 407 and the pulleys 408 and 409, in accordance with the operation of the micrometer 406.

Figure 20:
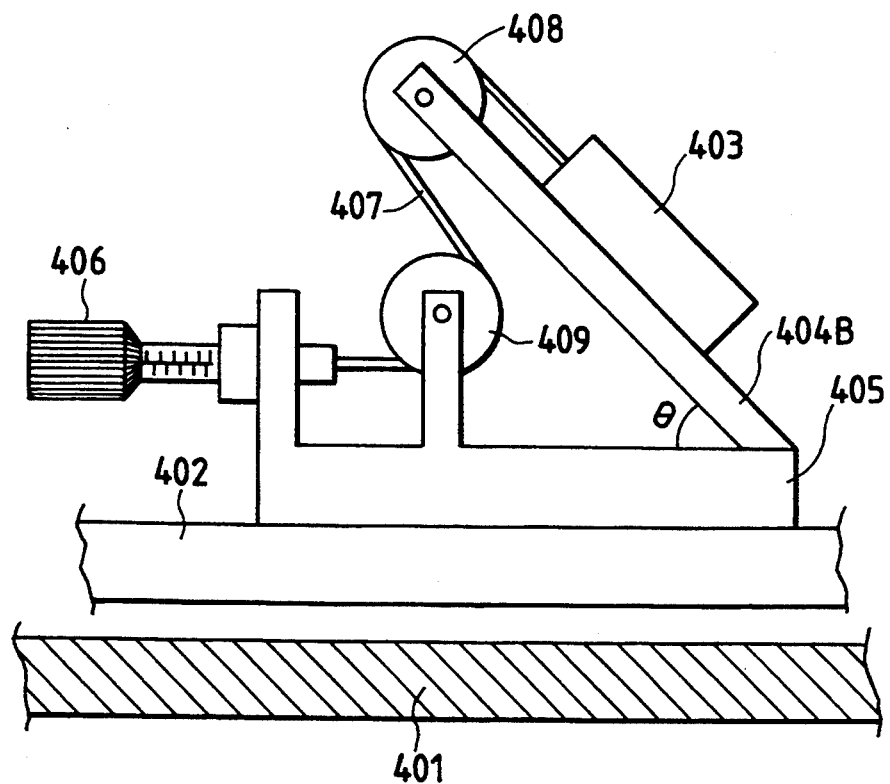

As illustrated in FIG. 20, the supporting base 404A is removed, and instead a supporting base 404B provided with the fixed terminal at its end is fixed and supported onto the stationary base 405 so that its longitudinal axis is situated to make a preset angle $\theta$ with the plate 402. Thus, by operating the micrometer 406, the stage 403 can be moved by the angle $\theta$ with respect to the plate 402.

In this way, the use of a plurality of supporting bases, such as the members 404A and 404B, makes it possible to set the direction of movement of the stage 403 at will. Further, a rail with a fixed groove is provided such that the fixed terminals holding the supporting bases 404A and 404B and the stationary base 405 can be stepwise fixed. Additionally, the conversion from FIG. 19 to FIG. 20 is carried out by the system of not removing and replacing the supporting base as mentioned above, but moving the connection of the end of the supporting base with the stationary base 405. By doing so, it is possible to arbitrarily choose the tilting angle $\theta$ of the longitudinal axis of the supporting base.

Figure 21:
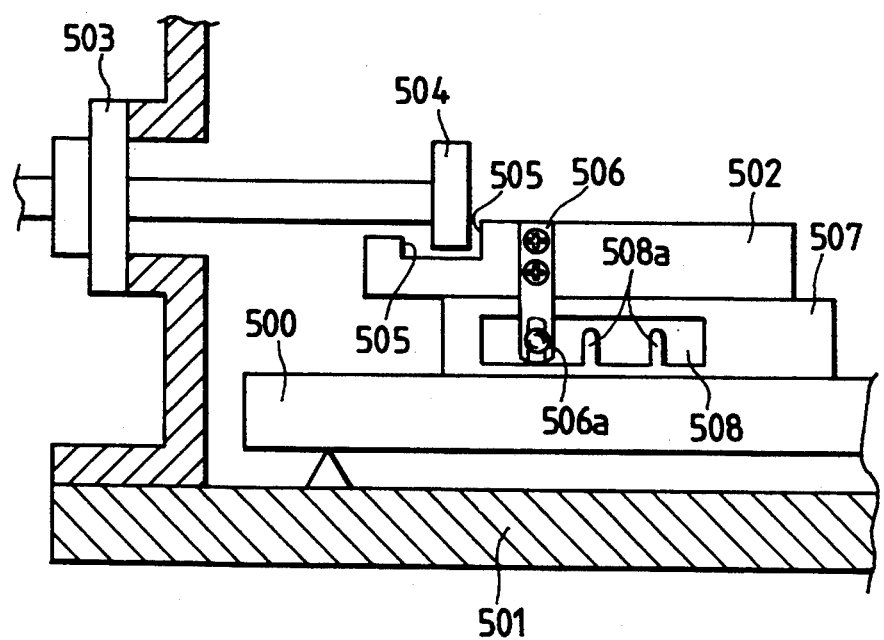

FIG. 21 schematically shows the mechanism for operating a stage 502 fixed onto a plate 500 in a vacuum chamber 501 from outside the vacuum chamber. A hook 504 at the tip of a linear guide terminal 503 pushes and pulls groove shoulders 505 of the stage 502, thereby driving the stage 502. There is clearance between the hook 504 and the groove shoulders 505 so that even though the vacuum chamber 501 is deformed, the stage 502 is not free to move. Since the stage 502 is provided with a plate spring 506 to which a steel ball 506a is attached, and a stage mounting base 507 is provided with a rail 508 on which slots 508a are cut perpendicular to the direction of the stage movement, the stage 502 is surely stopped at one of some set positions. The mechanisms shown in FIGS. 18 to 21 are used for the stages shown in FIG. 14 in accordance with the relative distance between the stages, the position of the micrometer, the driving accuracy of the stage, etc. Further, the vacuum chambers are equipped with windows so that the scale of the micrometer and the position of each stage are visible through the air. Also, in the above explanation, the members to be moved, such as the stage and the stage supporting base, constitute a moving mechanism; the members, such as the handles and the rotary and linear guide terminals, constitute a driving mechanism; and the members for connecting the moving mechanism and the driving mechanism to transmit the power, such as the universal joint and the flexible shaft, constitute a transmission mechanism.

Next, reference is made to the functions of the first embodiment constructed as mentioned above.

First, when the gate valve 48 is opened without evacuating the vacuum chambers 35 and 43, and the visible light mirrors 34 and 42 are inserted in the soft X-ray optical path, visible light emitted from the visible light source 50 is bent by the visible light mirror 34 and conducted to the condenser lens 32. The visible light is then concentrated by the condenser lens 32 to illuminate the sample 55. The visible light transmitted and diffracted by the sample 55 is conducted to the objective lens 33 and then undergoes a convergent action by the objective lens 33. The visible light, after its optical path is folded by the visible light mirror 42, is imaged as a magnified sample image at a position conjugate with the light-receiving face of the soft X-ray detector 41. The sample image is observed through the eyepiece 51 with the naked eye. Hence, an operator can observe the image of the sample 55 formed by the visible light and can use the mechanisms illustrated in FIGS. 18 to 21 to perform optical alignment and focusing while making observations by the visible light.

Second, the gate valve 48 is closed for evacuation. Since the plates 36 and 44 come into mere contact with the ends 35a, 35b, and 35c; and 43a, 43b, and 43c of the bottom plates of the vacuum chambers 35 and 43, respectively, the optical system placed on the plates 36 and 44 is not misaligned even in the deformation of the vacuum chambers. Further, the power transmission for driving each stage is performed by using the power transmission mechanism described above. Thus, even though the side plates of the vacuum chambers are deformed, misalignment will not be caused since an unnecessary force is not applied to the stages by the bending of the flexible shaft 307 and the expansion of the universal joint 304.

For evacuation, the rotary pumps 201 and 202 are started in the condition of closing the conductance valves 205 and 206, and then the valves 205 and 206 are gradually opened for evacuation. Such gradual evacuation prevents the occurrence of a rapid air flow in the vacuum chambers, and does not cause the misalignment and the damage of an internal thin film structure which are attributable to its impact. Thus, when a vacuum in the vacuum chambers reaches up to several torrs, the rapid air flow will no longer occur even though the conductance valves 205 and 206 are fully opened. Because much time is not required to attain such a vacuum, the loss of time for evacuation while the conductance valves are gradually opened is small compared with the time required to reach a high vacuum sufficient for observation.

The gate valve 48 disposed at the midpoint of the pipe 47 between the vacuum chambers obstructs the flow of air from one vacuum chamber to the other in initial evacuation to prevent the damage of the internal thin film structure, and can always hold the detector to a high vacuum because the evacuation is carried out with two systems. This makes it possible to appreciably reduce the time from the start of evacuation to the observation. If the vacuum chambers 35 and 43 are connected by means of the pipe 47 small in conductance (the reciprocal of flow resistance), differential evacuation becomes possible. Thus, even though the gate valve 48 is opened in the condition of a vacuum of $1 \times 10^{-4}$ torr necessary for the production and transmission of soft X rays in the vacuum chamber 35, the vacuum chamber 43 can be held to a vacuum of $1 \times 10^{-6}$ torr. It is, therefore, not necessary to wait for a long time until the vacuum chamber 35 reaches a high vacuum. For the pipe 47, it is desirable that its diameter is small to diminish the conductance, but the use of a small diameter increases the diffused reflections of visible light and vacuum-ultraviolet light within the pipe. The shielding plates 49 prevent the diffused reflections and serve to reduce the conductance of the pipe 47. Further, the pressure difference between the two vacuum chambers can be maintained.

Next, only the visible light reflecting mirror 34 is removed from the soft X-ray optical path, and after each of the vacuum chambers 35 and 43 reaches a predetermined vacuum, the gate valve 48 is opened. Laser radiation from the pulse laser 52 is focused onto the metallic target 31 by the collecting lens 54, and white plasma radiation including soft X rays is produced. The produced plasma radiation is converged by the condenser lens 32 to illuminate the sample 55. The plasma radiation transmitted and diffracted by the sample 55 is conducted to the objective lens 33 and undergoes the convergent action of the objective lens 33. The plasma radiation, after its optical path is folded by the visible light reflecting mirror 42, is imaged at a position conjugate with the soft X-ray detector 41 and observed through the eyepiece 51 with the naked eye. At this time, by the antireflection film of the visible light reflecting mirror 42 and the antitransmission film of the eyepiece 51, the wavelength of the laser radiation is cut off and a favorable visible image without speckle patterns can be derived. In this case, since the high-power pulse laser 52 is conducted through the fiber bundle 53 directly before the collecting lens 54, the optical path of the laser radiation is not exposed and is in a safe condition. Moreover, it is not necessary to place the laser on the vibration-proof base, which can be made small. Because the lower portion of the vibration-proof base is usually empty, if the body of the laser 52 is placed there, the entire soft X-ray microscope system becomes compact. Further, the MCP with the face of fluorescence emitted with the wavelength different from that of the incident laser radiation is used as the detector 41. This makes observation easy.

Also, although in the first embodiment the plates 36 and 44 are supported at the ends of the bottom plates of the vacuum chambers, they may be supported in any other places, irrespective of the bottom, side, and upper faces, if the displacement is small. Further, although all the driving mechanisms for the stages are designed to be operated from outside the vacuum chambers, only the mechanisms required according to the space of the vacuum chamber and for the optical system may be operated from outside the vacuum chambers and the other mechanisms may well be conventional driving mechanisms. Moreover, although the spheroidal mirror is used as the condenser lens, and the Schwarzschild optical system as the objective lens, a Wolter optical system and a zone plate optical system may also be used. The gate valve 48 may well be connected directly with one of the vacuum chambers 35 and 43. For the antireflection film of the visible light reflecting mirror and the antitransmission film of the visible light eyepiece, either of them may well be used.

Figure 22A:
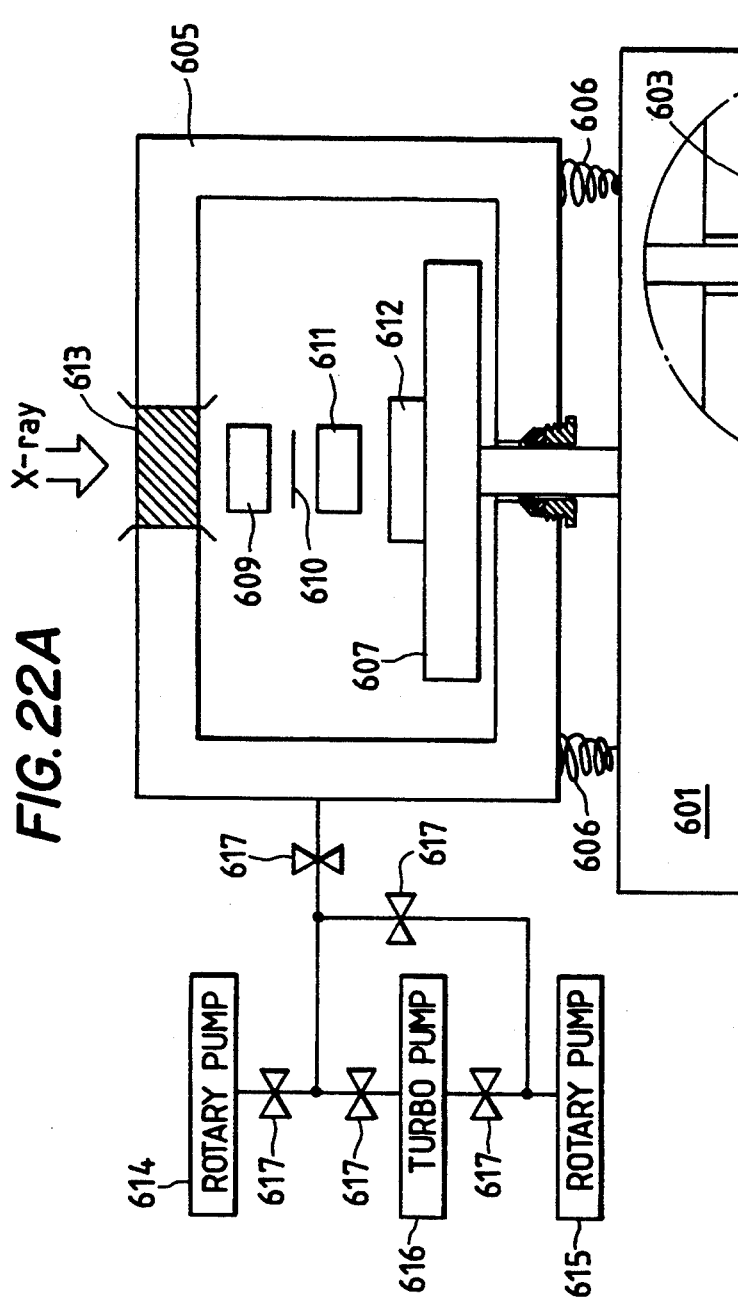
FIG. 22A is a side view showing essential parts of a second embodiment of the vacuum optical system according to the present invention.
Figure 22B:
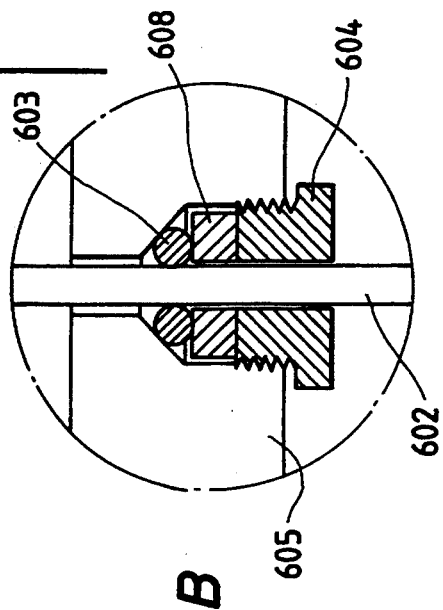
FIG. 22B is an enlargement of the dash line circle 22B in FIG. 22A.

FIGS. 22A and 22B show the essential parts of a second embodiment of the present invention. In this embodiment, an X-ray demagnifying exposure device is adopted as the optical system, and a radiation source is used as the soft X-ray source. The vacuum chamber and the turbo molecular pump for exhaust are placed on a surface plate. In FIG. 22A, reference numeral 601 denotes a surface plate; 602 a metallic rod fixed on the surface plate 601; 603 an O ring; and 604 a tool for clamping the O ring 603. The latter three components constitute a part of a vacuum chamber 605 holding a vacuum. Reference numeral 606 represents springs, which support the vacuum chamber 605. Numeral 607 represents a metallic plate provided with rigidity enough to hold the optical system, which is fixed to the metallic rod 602. Numeral 608 designates a packing gland for compressing the O ring 603. When the tool 604 is tightened, its clamping pressure is applied, through the packing gland 608, to the O ring 603. The O ring 603 thus pressed is deformed to block up the space surrounding the metallic rod 602 which connects the inside of the vacuum chamber 605 and the outside thereof, and holds a vacuum in the vacuum chamber 605. Reference numeral 609 designates a Schwarzschild condenser lens; 610 an X-ray mask; 611 a Schwarzschild demagnifying projection lens; and 612 a wafer, which are placed on the metallic plate 607 by a stage, not shown. Numeral 613 represents a transmission window for soft X rays, made of beryllium. To the vacuum chamber 605 are connected a rotary pump 614 of a small amount of exhaust, a rotary pump 615 of a larger amount of exhaust, and a turbo molecular pump 616. Numeral 617 represents butterfly valves.

The second embodiment is constructed as mentioned above and its functions are as follows:

The rotary pump 614 of a small amount of exhaust is first started for the evacuation of the vacuum chamber 605. Because the exhaust capacity of the rotary pump 614 is small, a rapid flow of air will not be caused in the vacuum chamber. Hence, the soft X-ray transmission window 613 will not be broken by its impact. When the vacuum of the vacuum chamber has reached up to several torrs, the rapid air flow is no longer produced even though the pump 614 is switched to the rotary pump 615 of a larger amount of exhaust. Since much time is not required to attain such a vacuum, the loss of time for evacuation gradually performed by the rotary pump 614 of a small amount of exhaust is small compared with the time required to reach a high vacuum sufficient for exposure. The chamber deformation caused by the variation of pressure in the vacuum chamber 605 is compensated by the springs 606, so that the metallic rod 602 is not deflected. Consequently, the metallic plate 607 fixed to the metallic rod 602 and mounting the optical system is not shifted with respect to the surface plate 601 before and after the evacuation of the vacuum chamber 605.

Although in the second embodiment the Schwarzschild optical systems are used for the condenser lens and the demagnifying projection lens, other soft X-ray optical systems, such as the Wolter optical systems, may well be employed. Further, in this embodiment, the metallic rod 602 is provided on the surface plate 601, but, for example, the metallic rod 602 can also be mounted horizontally to the wall of the surface plate lying on its side in such a way that the bottom face of the vacuum chamber 605 is supported by the springs compensating the vibration. This construction is favorable because the metallic plate 607 is fixed, through the metallic rod 602, to the wall even in the deformation of the vacuum chamber 605 and is not affected by the deformation. Hence, the condenser lens 609, the X-ray mask 610, the demagnifying projection lens 611, and the wafer 612 arranged on the metallic plate 607 supported only by the metallic rod 602 are also not affected by the deformation which is due to the evacuation. The same holds for the case of the metallic rod 602 except for vertical and horizontal mountings mentioned above.

Figure 23:
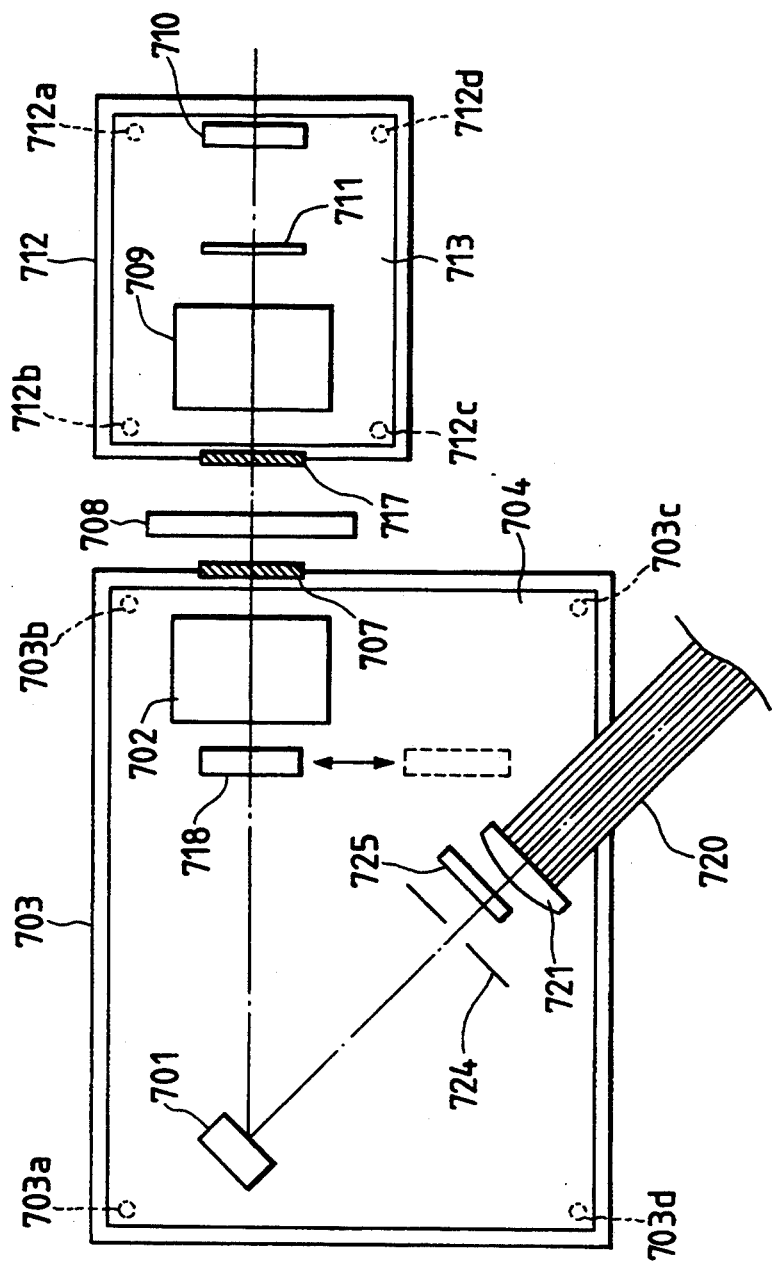
FIGS. 23 and 24 are plan and side views, respectively, showing a third embodiment of the vacuum optical system according to the present invention.
Figure 24:
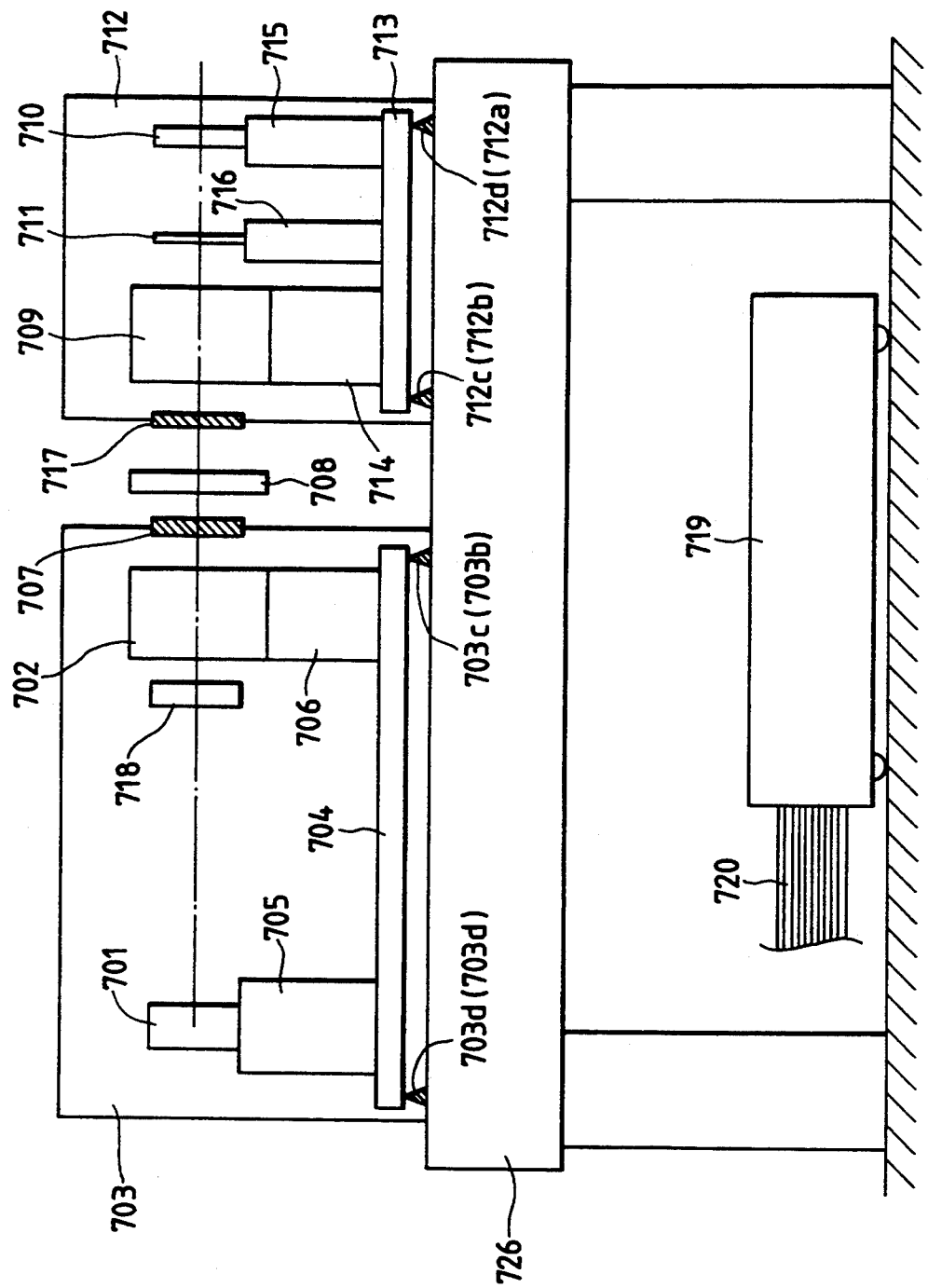

FIGS. 23 and 24 are plan and side views showing the essential parts of a third embodiment of the soft X-ray optical system according to the present invention. In this embodiment, a biological soft X-ray microscope is adopted as the optical system, and a laser plasma radiation source is used as the soft X-ray source. The vacuum chambers and the turbo molecular pump for exhaust are placed on the vibration-proof base. In FIGS. 23 and 24, reference numeral 701 represents a metallic target and 702 represents a Walter condenser lens. These components constitute an illumination system for soft X rays and are placed on stages 705 and 706, respectively, mounted on a plate 704 which is provided in a vacuum chamber 703 to prevent the absorption of soft X rays in air as far as possible. Soft X rays converged by the condenser lens 702 emerge from a thin film window 707, made of $Si_3N_4$, provided in the vacuum chamber 703 and illuminate a sample 708 placed in air. Reference numeral 709 denotes a Schwarzschild objective lens similar in structure to the condenser lens 702; 710 a soft X-ray detector using the CCD; and 711 a beryllium thin film used as a soft X-ray filter for cutting off visible light and vacuum-ultraviolet light, disposed in front of the soft X-ray detector 710. These components constitute a magnifying imaging system for soft X rays and are placed on stages 714, 715 and 716, respectively, mounted on a plate 713 which is provided in a vacuum chamber 712 to prevent the absorption of soft X rays in air as far as possible. Soft X rays transmitted and diffracted by the sample 708 are incident from a thin film window 717, made of $Si_3N_4$, provided in the vacuum chamber 712 and are converged onto the soft X-ray detector 710 by the objective lens 709. Also, the Schwarzschild optical system constituting the objective lens 709 is provided with the coating of an Ni/Ti multilayer having a high reflectance with respect to soft X rays of wavelengths in the "water window" region. Numeral 718 designates a glass plate with a thickness of 10 μm which is removably disposed in the optical path between the metallic target 701 and the condenser lens 702 by a means not shown, and which is coated with an antitransmission film relative to wavelengths of incident laser radiation.

Laser radiation from a high-power pulse YAG laser 719 is guided through an optical fiber bundle 720 to a collecting lens 721 in the vacuum chamber 703, and is converged by the collecting lens 721 onto the metallic target 701, which produces plasma radiation. The end of the optical fiber bundle 720 and the collecting lens 721 are placed on the plate 704 through stages not shown. These components constitute a soft X-ray radiation source system. A shielding plate 724 with an aperture larger than a laser diameter is disposed between the collecting lens 721 and the metallic target 701, and a glass plate 725 coated with an antireflection film relative to wavelengths of the laser radiation is disposed between the shielding plate 724 and the collecting lens 721. The shielding plate 724 is of a size such that contamination substances, at least, such as electrons, ions, and neutral particles, scattered from the metallic target 701 are prevented from adhering to the glass plate 725 and the collecting lens 721, except for the substances passing through the aperture of the shielding plate. The diameter of the glass plate 725 is of a size such that the contamination substances from the metallic target 701 which are at least scattered through the aperture of the shielding plate 724 are prevented from adhering directly to the collecting lens 721.

In the third embodiment, like the first embodiment, the plate 704 is supported at ends 703a, 703b, 703c, and 703d of the bottom plate of the vacuum chamber 703, while the plate 713 is supported at ends 712a 712b, 712c, and 712d of the bottom plate of the vacuum chamber 712. Further, individual stages can be operated from outside the vacuum chambers by using the mechanisms such as those shown in FIGS. 18 to 21.

Since the third embodiment is constructed as mentioned above, even though alignment and focusing with visible light are performed by a means, not shown, without evacuating the vacuum chambers 703 and 712 and then the evacuation is carried out, misalignment will not be caused because the amounts of displacement of the plates 704 and 713 are smaller than the tolerances of alignment.

Next, the glass plate 718 is inserted in the soft X-ray optical path and the soft X-ray filter 711 is removed from the optical path. After the vacuum chambers 703 and 712 have attained a predetermined vacuum, the laser radiation from the pulse laser 719 is concentrated by the collecting lens 721, and white plasma radiation containing soft X rays is produced. Because the laser is introduced into the vacuum chamber 703 by the optical fiber bundle 720, the optical path of the laser is not exposed in the air for great safety. The produced plasma radiation is incident on the glass plate 718, where the soft X rays and the contamination substances from the target 701 are cut off. Thus, in alignment and focusing with visible light and in microscopy, the soft X rays unnecessary for the sample 708 are not exposed, and the biological sample can be maintained in vivo until the subsequent soft X-ray microscopy. The contamination substances from the target 701 undergo elastic reflection by the optical system, such as the condenser, and may adhere to, or break, the subsequent X-ray transmission window 707. Hence, as mentioned above, it is favorable to cut off the contamination substances scattered in the observation of visible light. Further, since the glass plate 725 can be moved by the operation from outside the vacuum chamber, its new, clean surface can be directed to the target 701, without releasing a vacuum, even though the contamination particles adhere to the glass plate 725.

Although in the third embodiment the glass plate 718 for cutting off the soft X rays and the contamination substances is situated between the target 701 and the condenser lens 702, it may well be located directly behind the condenser lens 702. The Schwarzschild optical systems are used as the condenser lens and the objective lens, but, not to speak of this limitation, the Wolter optical system and the zone plate optical system can also be applied. Further, if plural optical systems are mounted on the stages and switched over on a revolver or slide system by the driving mechanism used in the third embodiment, an optical system suitable for an object to be observed can be chosen, without releasing a vacuum, from outside the vacuum chamber.

FIG. 25 shows a fourth embodiment of the present invention where a Schwarzschild optical system is employed as the X-ray optical element and a laser plasma radiation source is used as the radiation source. In this diagram, reference numeral 801 designates a rotating metallic target which comes to the X-ray source; 802 a pinhole; 803a and 803b, partitions for blocking scattered particles; 804a and 804b, magnets attached to the partitions 803a and 803b, respectively; 805 a microchannel plate (MCP) with an aperture at its center; and 806 a moving stage on which an X-ray imaging optical system is mounted. All of these components are placed on a stainless base plate 808 with a thickness of 10 mm which is mounted on the bottom plate of a vacuum chamber 807. Reference numeral 809 represents a Schwarzschild optical system for focusing X rays onto a sample 810; 811 a PZT element for scanning two-dimensionally the sample 810; 812 a thin film filter, for example, made of boron, for removing ultraviolet light; 813 an MCP for detecting X rays transmitted through the sample 810; and 814 an objective lens for visible light, all of which are placed on the moving stage 806. Reference numeral 815 represents an A/D converter for converting the detecting signal of each of the MCPs 805 and 813 into a digital signal; 816 a sample stage driving circuit for outputting a driving signal to each of the driving stage 806 and the driving elements and the PZT element 811 which are placed on the driving stage 806 when the optical system is aligned; 817 a personal computer for controlling the sample stage driving circuit 816 and for processing the detecting signal converted into the digital signal by the A/D converter 815; and 818 an Nd:YAG laser disposed outside the vacuum chamber 807.

A laser beam emitted from the Nd:YAG laser 818 is concentrated on the metallic target 801 in the vacuum chamber 807. The irradiated part of the metallic target 801 is thus changed to the plasma, and X rays originate therefrom and come to X-ray source radiation through the pinhole 802. The partitions 803a and 803b are provided with apertures equal in size to the effective diameter of X rays incident on the Schwarzschild optical system 809 and are disposed in the X-ray optical path. The magnets 804a and 804b form magnetic fields in the direction normal to the optical axis. Consequently, for the scattered particles discharged from the laser plasma radiation source, most of them, notably particles traveling outside the effective diameter of X rays are blocked by the partitions 803a and 803b, while those traveling inside the effective diameter are deviated from the optical path by the magnets 804a and 804b. In this way, the scattered particles can be prevented from entering the Schwarzschild optical system 809. At the same time, stray light of long wavelengths, such as ultraviolet light, emitted from the radiation source is also blocked.

The aperture of the MCP 805 has a size enough to avoid eclipsing X rays on the optical axis which are incident on the effective diameter of the Schwarzschild optical system 809. Thus, the X rays passing through the partitions 803a and 803b traverse such an aperture of the MCP 805 and enter the Schwarzschild optical system 809. The MCP 805 is adapted to detect the variation of intensity of X rays diffused outside the aperture, and the detected value of intensity is input through the A/D converter 815 into the personal computer 817.

The X rays incident on the Schwarzschild optical system 809 are focused on the sample 810 by the optical system 809. The X rays transmitted through the sample 810 traverse the thin film filter 812, with the resultant elimination of noise components, and are detected by the MCP 813. The thin film filter 812 serves to prevent residual particles in the vacuum chamber 807 from being incident directly on the MCP 813 and to reduce the background noise of the transmitted microscope image. As such, it is desirable that the thin film filter 812 is located as close to the MCP 813 as possible.

The sample 810 is such that fine and coarse adjustments are made in a three-dimensional direction from the optical axis. The fine and coarse adjustments in the direction of the optical axis are made by an inch-worm stage, and a two-dimensional movement in a plane normal to the optical axis is conducted by a step motor for coarse adjustment and the PZT element 811. The positions of the MCP 813 and the objective lens 814 for visible light are shifted from outside the vacuum chamber 807 by the guide terminal, and when the objective lens 814 is located on the optical axis, it is possible to observe the visible light of the sample 810 by visible laser radiation scattered from the metallic target 801.

The detecting signals of the MCPs 805 and 813 are input through the A/D converter 815 into the personal computer 817. In the personal computer 817, the detected signal value of the MCP 813 is normalized (divided) by the intensity variation of the source radiation, namely the detected signal value of the MCP 805, for correction, and the detecting signal thus corrected is stored as the transmitted microscope image data of the sample 810 into a frame memory. Consequently, the transmitted microscope image is displayed on a CRT display not shown.

According to the above construction of the fourth embodiment, in which the entire optical system including the radiation source is placed on the stainless base plate 808 mounted on the bottom plate of the vacuum chamber 807, the misalignment of the optical system is not caused even though the vacuum chamber 807 is deformed, and thus accurate alignment can be maintained before and after evacuation. If the stainless base plate 808 of medium weight is mounted in the vacuum chamber 807, the deformation of the bottom plate itself of the vacuum chamber 807 can be prevented. Further, the arrangement of the partitions 803a and 803b and the magnets 804a and 804b on the X-ray optical path makes it possible to effectively remove the scattered particles and stray light which are discharged from the radiation source and travel inside and outside the X-ray optical path. Additionally, by normalizing the detected signal value of the sample 810 in accordance with the intensity variation of the source radiation, the transmitted microscope image can be obtained which has minimum image noise and is sharp and high in quality.

Also, although in the fourth embodiment the Schwarzschild optical system is used as the X-ray optical element, other optical systems, such as zone plate and Wolter types, can also be used. Further, the MCP with an aperture is employed as an X-ray detector for monitoring the intensity variation of the source radiation, but in order to detect X rays diffused outside the optical axis, an ordinary MCP with no aperture may be disposed at the position where X rays are not blocked in the optical path. The X-ray detector nay well be substituted by any detector that is sensitive to X rays, such as a channeltron multiplier or photomultiplier tube, not to speak of the MCP.

FIGS. 26 and 27 show a fifth embodiment of the present invention, which provides an alignment mechanism using an He-Ne laser. In these figures, a laser beam is emitted from a laser radiation source, not shown, and concentrated onto the metallic target 801. X rays are thus produced and, through the pinhole 802, a partition 803 with an aperture, a grazing incidence mirror 820 with an aperture, and a half mirror 821a which are arranged on the optical axis, are incident on an X-ray imaging optical system 822. In the X-ray imaging optical system 822, the X rays are focused on a sample by an X-ray optical element, not shown, and the X rays transmitted through the sample are detected to secure a transmitted microscope image.

The scattered particles discharged from the laser radiation source are blocked by the partition 803 and a magnet 804 which is attached to the partition 803 and forms a magnetic field in the optical path. The grazing incidence mirror 820 deflects unwanted X rays diffused and traveling around the aperture of the grazing incidence mirror 820 to introduce them into a channel multiplier 825. By the unwanted X rays introduced into the channel multiplier 825, the intensity variation of the source radiation is detected, and this detected value comes to a reference value of variation for normalizing the detected value of the transmitted microscope image. The surface of the grazing incidence mirror 820 may well be coated with the multilayer film so that X rays of particular wavelength is conducted to the channel multiplier 825. These components constituting the optical system are placed on the stainless base plate 808 mounted on the bottom plate of the vacuum chamber 807 to maintain accurate alignment, irrespective of the deformation of the vacuum chamber 807 which may be caused before and after evacuation.

When alignment is adjusted, the laser radiation emitted from an He-Ne laser radiation source 826 is conducted through a mirror 827a, or through mirrors 827b, 827c, and 827d when the mirror 827b is disposed in the optical path, and through a view port 824b or 824c into the vacuum chamber 807. The laser radiation conducted into the vacuum chamber 807 is made coincident with the optical axis of X rays by the half mirror 821a when conducted through the view port 824c, and by a half mirror 821b when conducted through the view port 824b. Thus, the X-ray optical system including the radiation source, the pinhole, the objective lens, etc. is aligned with this laser beam as a reference.

The half mirror 821b is attached to the tip of a linear guide mechanism 828a provided on the side of the vacuum chamber 807 so as to be removable with respect to the optical axis by operating the mechanism 828a from outside the chamber. Consequently, if, even in experiments after evacuation, the mechanism 828a is operated to bring the half mirror 821b onto the optical axis, the accuracy of alignment can be confirmed through a view port 824a. Further, the use of a linear guide mechanism 828b makes it also possible to shift the position of the X-ray imaging optical system 822 from outside the vacuum chamber 807.

In the fifth embodiment, if a knife edge, instead of the sample, is disposed and the image of the pinhole is scanned, an MTF function can be obtained. Hence, this arrangement can be utilized for evaluating the X-ray imaging optical system. Also, this embodiment is designed so that the optical components mounted on the stainless base plate 808 are fixed through optical reference holes, not shown, provided on the base plate 808.

Figure 28:
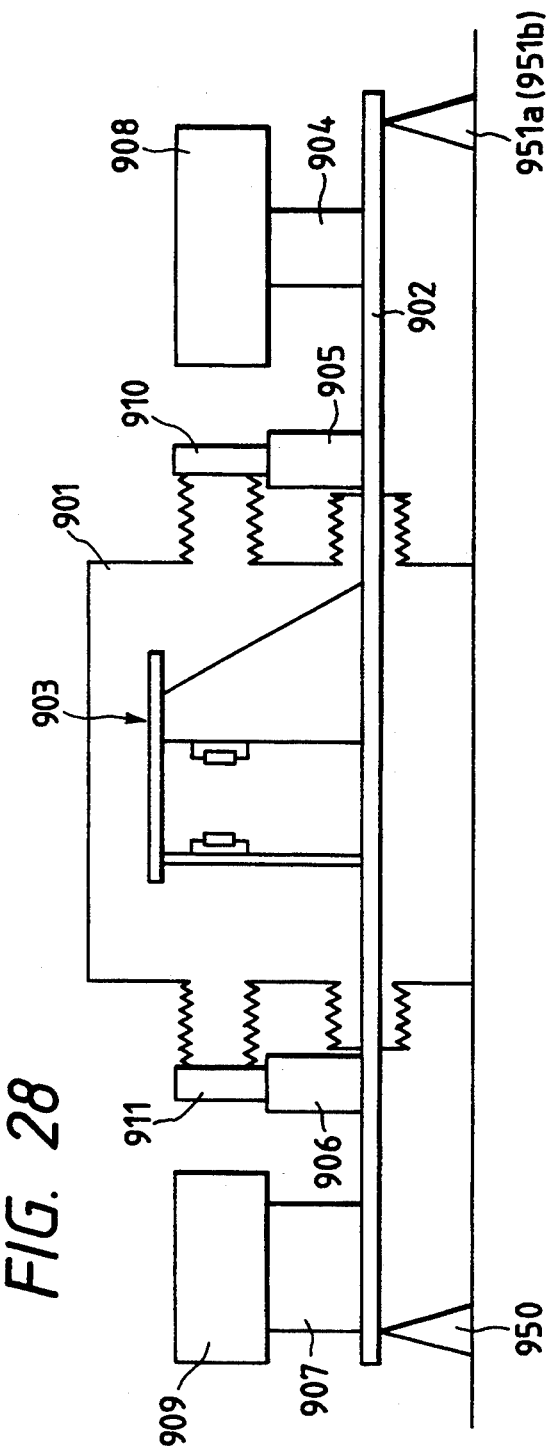
FIG. 28 is a side view showing a sixth embodiment according to the present invention.

FIG. 28 shows a sixth embodiment of the present invention which is a device used in an absolute measurement of wavelength originating from a stabilizing laser. A vacuum chamber 901 is provided with a base plate 902, on which a Fabry-Perot interferometer 903 is placed. The base plate 902 extends through bellows into the air, and stages 904, 905, 906, and 907 are mounted on both side of the base plate 902 which are exposed in the air. On the stage 904 is mounted a radiation source system 908 including a laser for emitting radiation to be measured, while on the stage 907 is mounted a detection system 909 including a photomultiplier tube. Vacuum windows 910 and 911 connected through bellows with the vacuum chamber are mounted on the stages 905 and 906, respectively. For coarse and fine adjustments of the interference system 903, the driving mechanisms shown in FIGS. 18 to 21 are provided.

If the vacuum chamber 901 is evacuated of air after optical alignment in the air, the vacuum chamber 901 will be deformed because of the atmospheric pressure. However, the base plate 902, which is merely held at points 950, 951a, and 952b, is not subjected to a bending stress, and thus the relative positions of the components 903, 908, 909, 910, and 911 constituting the entire optical system remain unchanged.

For the measurement, after a complete evacuation, the fine adjustment of the interferometer 903 is made and a gas is conducted into the vacuum chamber 903 by means of a valve, not shown, to measure a change in intensity of radiation which has traversed the interferometer. In this case also, a change by the induction of gas, of the pressure difference between the interior and the exterior of the vacuum chamber 901 causes the deformation of the vacuum chamber 901. As explained above, however, the relative positions remain unchanged. Thus, the measurement of a high degree of accuracy becomes possible.

Figure 7:
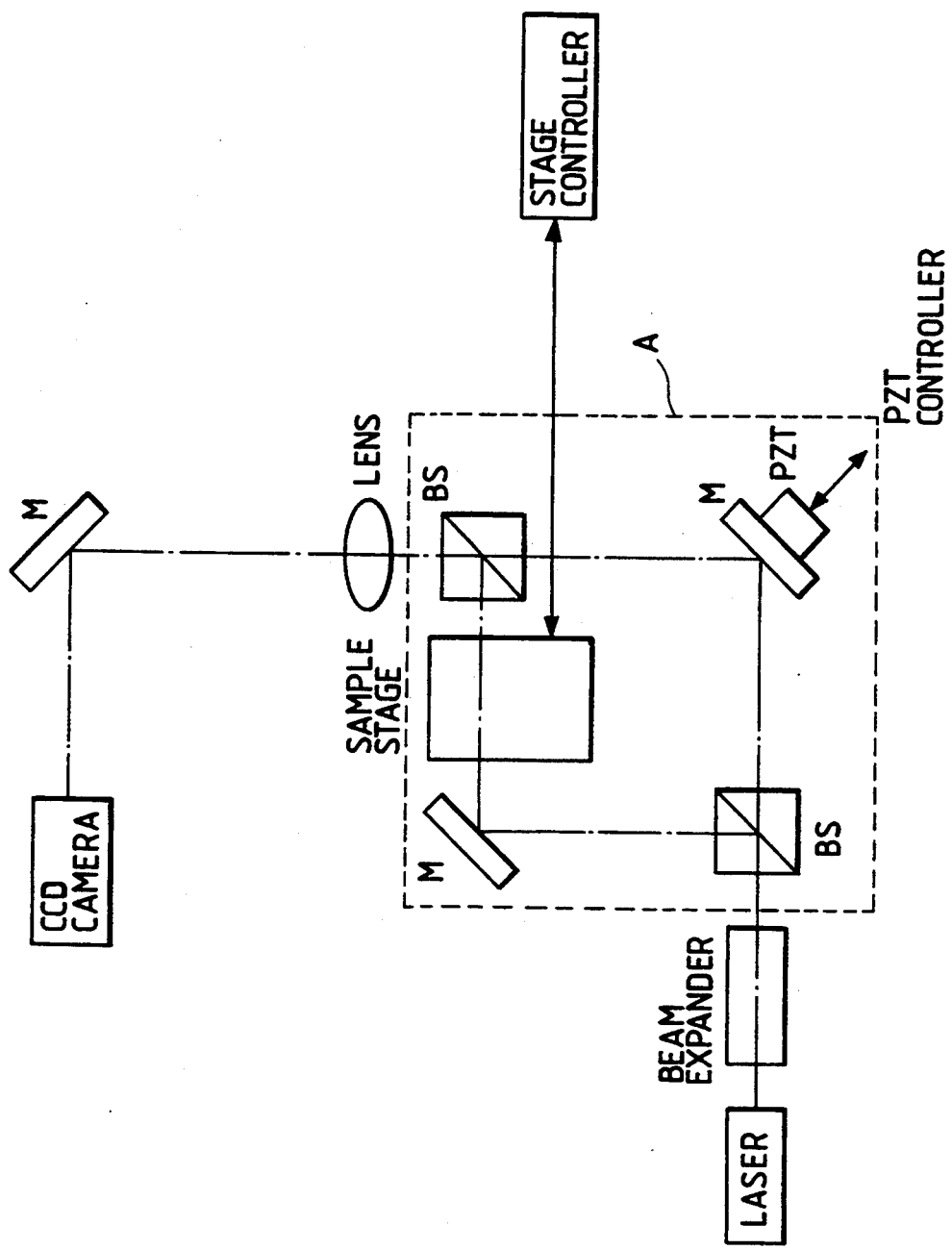
FIG. 7 is a view showing a measuring device using a Mach-Zehnder interferometer.
Figure 8:
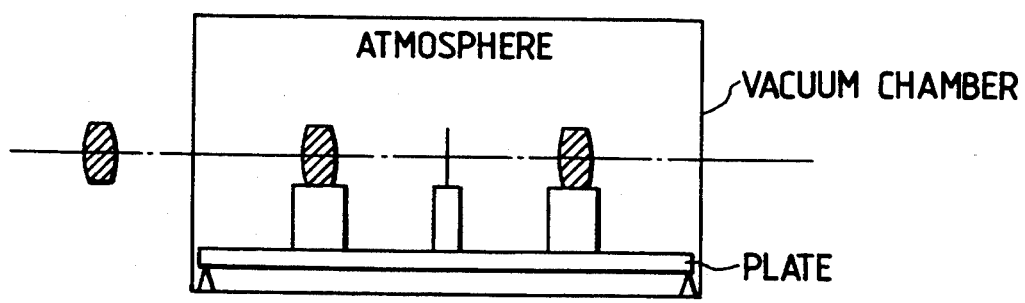
FIGS. 8 and 9 are explanatory views showing the states of optical alignment where a vacuum chamber is in atmospheric and vacuum conditions, respectively, in a vacuum optical system according to the present invention.
Figure 9:
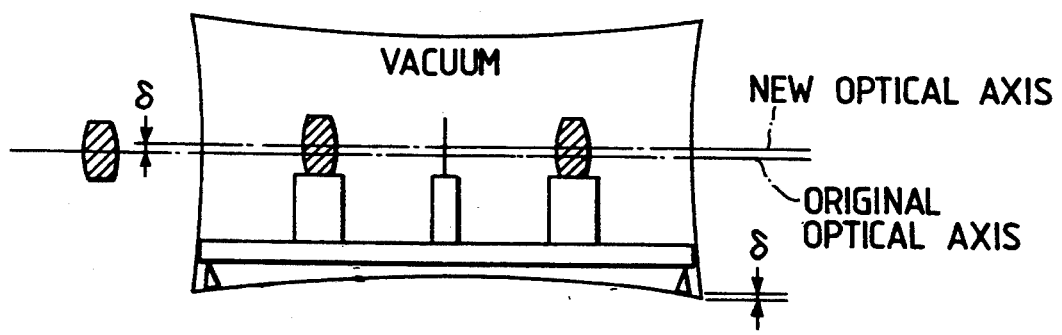
Figure 10:
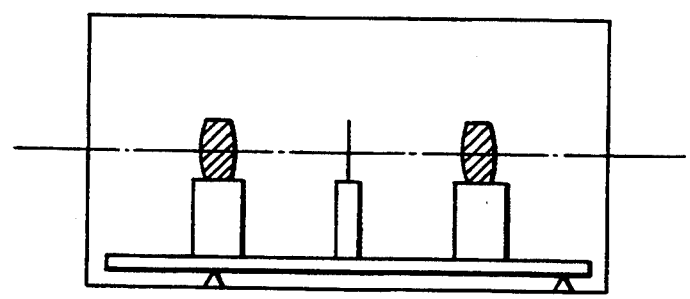
FIGS. 10 to 12 are views showing how the complete optical system is situated in the vacuum chamber of the vacuum optical system of the present invention.
Figure 11:
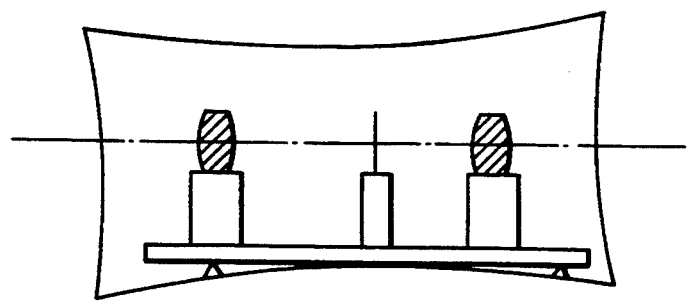
Figure 12:
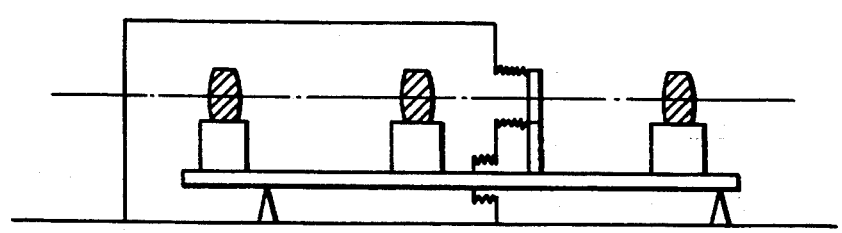
Figure 29:
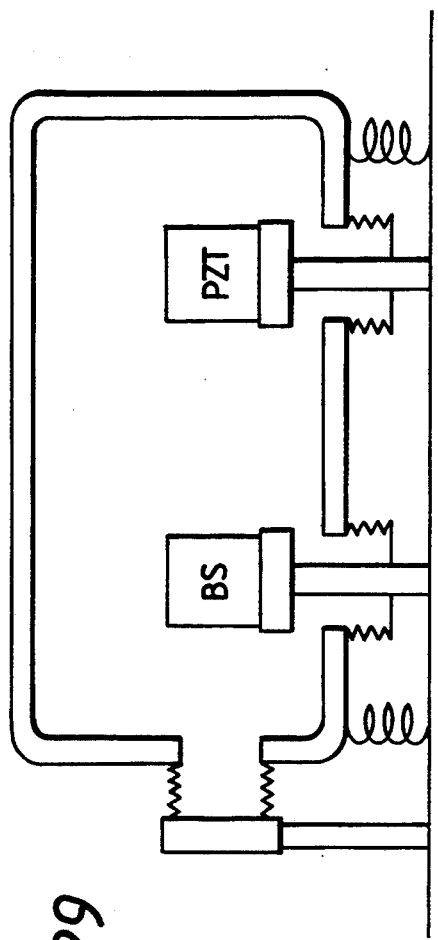
FIG. 29 is a side view showing a seventh embodiment according to the present invention.

FIG. 29 shows a seventh embodiment of the present invention. The measuring device using a Mach-Zehnder interferometer shown in FIG. 7 is adapted to measure the path difference of split light. For this purpose, where the measurement is made with the tolerance of hundredth of wavelength of the light, the measured result is largely affected by the disturbance and the difference of density of air in the portion A surrounded by a broken line shown in FIG. 7, for splitting and recombining the optical path. In this case, by using the elements 602 to 607 in FIG. 22, or bellows, and employing the driving mechanisms in FIGS. 18 to 21 and the PZT element, the structure shown in FIG. 29 can be attained. Thus, the measurement of a high degree of accuracy becomes possible.

Any of the embodiments mentioned above, as shown in FIG. 15, can solve the problem of misalignment by placing the whole optical system on a single member 59. In this case, the mechanisms shown in FIGS. 18 to 21 can also be effectively used. Further, a soft X-ray optical element for focusing soft X rays emitted from the soft X-ray source onto the object and another soft X-ray optical element for converging soft X rays or fluorescent X rays transmitted through, or scattered from, the object at a predetermined position are used selectively from the Schwarzschild optical system, the Wolter optical system, the zone plate optical system, and others. For the two vacuum chambers, where the detector needs a high vacuum, it is desirable that the detector and the optical system excluding the detector are incorporated in different chambers. This is because the evacuation with two systems brings about a high vacuum in a short time and the sample is replaceable without lowering the vacuum of the detector chamber, with a resultant considerable reduction of the time from the subsequent evacuation to observations.

What is claimed is:

1. A vacuum optical system comprising a vacuum chamber for incorporating an optical system used in a vacuum and having a predetermined accuracy, said vacuum chamber being equipped with a member, on which said optical system is at least mounted, said member being unmountedly supported by a support such that when a pressure in said vacuum chamber changes to deform Said vacuum chamber, an amount of displacement transmitted to said optical system being smaller than a predetermined tolerance depending on said predetermined accuracy necessary for said optical system.

2. A vacuum optical system comprising a vacuum chamber for incorporating an optical system used in a vacuum, wherein a whole optical system including a radiation source, said optical system used in a vacuum, and a detector for detecting rays emitted from said radiation source and passing through said optical system are mounted on a single optical-system mounting member provided in said vacuum chamber.

3. A vacuum optical system comprising a vacuum chamber for incorporating an optical system used in a vacuum and having a predetermined accuracy, said vacuum chamber being equipped with a member, on which said optical system is at least mounted, supported by such parts that when a pressure in said vacuum chamber changes to deform said vacuum chamber, an amount of displacement transmitted to said optical system being smaller than a predetermined tolerance depending on said predetermined accuracy necessary for said optical system, and wherein a device having a moving mechanism for moving said vacuum optical system on said member on which said optical system is mounted is connected, through a power transmission mechanism having means for compensating said deformation of said vacuum chamber, with a driving mechanism for driving said moving mechanism attached to said vacuum chamber.

4. A vacuum optical system comprising a vacuum chamber for incorporating an optical system used in a vacuum, wherein a whole optical system including a radiation source and said optical system used in a vacuum is mounted on a single optical-system mounting member provided in said vacuum chamber, wherein a device having a moving mechanism for moving said vacuum optical system on said single optical-system mounting member on which said optical system is mounted is connected, through a power transmission mechanism having means for compensating deformation of said vacuum chamber, with a driving mechanism for driving said moving mechanism attached to said vacuum chamber.

5. A vacuum optical system according to claim 1, wherein wavelengths of soft X rays are used, and wherein said optical system includes one soft X-ray optical element for focusing soft X rays emitted from a soft X-ray source onto an object and another soft X-ray optical element for converging one beam selected from a group including soft X rays and fluorescent X rays transmitted through said object at a predetermined position.

6. A vacuum optical system according to claim 1, wherein wavelengths of soft X rays are used, and wherein said optical system includes one soft X-ray optical element for focusing soft X rays emitted from a soft X-ray source onto an object and another soft X-ray optical element for converging one beam selected from a group including soft X rays and fluorescent X rays scattered from said object at a predetermined position.

7. A vacuum optical system according to claim 1, wherein wavelengths of soft X rays are used, and wherein said optical system includes a soft X-ray optical element for focusing soft X rays emitted from a soft X-ray source onto an object.

8. A vacuum optical system according to claim 1, wherein wavelengths of soft X rays are used, and wherein said optical system includes a soft X-ray optical element for converging one beam selected from a group including soft X rays and fluorescent X rays transmitted through an object at a predetermined position.

9. A vacuum optical system according to claim 1, wherein wavelengths of soft X rays are used, and wherein said optical system includes a soft X-ray optical element for converging one beam selected from a group including soft X rays and fluorescent X rays scattered from an object at a predetermined position.

10. A vacuum optical system according to claim 2, wherein wavelengths of soft X rays are used, and wherein said optical system includes one soft X-ray optical element for focusing soft X rays emitted from a soft X-ray source onto an object and another soft X-ray optical element for converging one beam selected from a group including soft X rays and fluorescent X rays transmitted through said object at a predetermined position.

11. A vacuum optical system according to claim 2, wherein wavelengths of soft X rays are used, and wherein said optical system includes one soft X-ray optical element for focusing soft X rays emitted from a soft X-ray source onto an object and another soft X-ray optical element for converging one beam selected from a group including soft X rays and fluorescent X rays scattered from said object at a predetermined position.

12. A vacuum optical system according to claim 2, wherein wavelengths of soft X rays are used, and wherein said optical system includes a soft X-ray optical element for focusing soft X rays emitted from a soft X-ray source onto an object.

13. A vacuum optical system according to claim 2, wherein wavelengths of soft X rays are used, and wherein said optical system has a soft X-ray optical element for converging one beam selected from a group including soft X rays and fluorescent X rays transmitted through an object at a predetermined position.

14. A vacuum optical system according to claim 2, wherein wavelengths of soft X rays are used, and wherein said optical system has a soft X-ray optical element for converging one beam selected from a group including soft X rays and fluorescent X rays scattered from an object at a predetermined position.

15. A vacuum optical system according to any one of claims 5–9, wherein wavelengths of soft X rays are used, and wherein a soft X-ray microscope using a laser plasma radiation source, as said optical system, comprises:

an X-ray detector for monitoring a variation of intensity of a source radiation;
partitions arranged between said laser plasma radiation source and said soft X-ray optical element; and
means for forming magnetic fields in a direction perpendicular to an optical axis.

16. A vacuum optical system according to any one of claims 10–14, wherein wavelengths of soft X rays are used, and wherein a soft X-ray microscope using a laser plasma radiation source, as said optical system, comprises:

an X-ray detector for monitoring a variation of intensity of a source radiation;
partitions arranged between said laser plasma radiation source and said soft X-ray optical element; and
means for forming magnetic fields in a direction perpendicular to an optical axis.

17. A vacuum optical system according to claim 2, wherein said vacuum chamber comprises:

a first vacuum chamber area for incorporating a first part of said optical system including said detector for detecting radiation used in said vacuum optical system; and
a second vacuum chamber area for incorporating second part of said optical system excluding said first part of said optical system contained in said first vacuum chamber area; and
a connecting pipe for connecting said first vacuum chamber area and said second vacuum chamber area and provided with a gate valve for opening and closing to separate said connecting pipe.

18. A vacuum optical system according to claim 17, wherein said connecting pipe is provided with diffusion-proof members for preventing diffusion of radiation.

19. A vacuum optical system according to claim 1, wherein said vacuum chamber comprises a first vacuum chamber area for incorporating a first part of said optical system including said detector for detecting radiation used in said vacuum optical system and a second vacuum chamber area for incorporating a second part of said optical system excluding said first part of said optical system contained in said first vacuum chamber area, said vacuum optical system further comprising a connecting pipe for connecting said first vacuum chamber area and said second vacuum chamber area provided with a gate valve for opening and closing to separate said connecting pipe.

20. A vacuum optical system according to claim 19, wherein said connecting pipe is provided with diffusion-proof members for preventing diffusion of radiation.

21. A vacuum optical system according to claim 1, wherein said support comprises three only contact points with said member.

22. A vacuum optical system according to claim 2, wherein said single optical-system mounting member is supported by three only supports from said vacuum chamber.

23. A vacuum optical system according to claim 1, wherein said support is not mounted to but merely contacts said member in said vacuum chamber.

24. A vacuum optical system according to claim 2, wherein said single optical-system mounting member is not mounted to but merely contacts a plurality of supports.

* * * * *